(12) United States Patent
Koyama et al.

(10) Patent No.: US 6,784,495 B2
(45) Date of Patent: *Aug. 31, 2004

(54) SEMICONDUCTOR DEVICE

(75) Inventors: Jun Koyama, Kanagawa (JP); Hidehito Kitakado, Hyogo (JP); Masataka Itoh, Nara (JP); Hiroyuki Ogawa, Nara (JP)

(73) Assignees: Semiconductor Energy Laboratory Co., Ltd. (JP); Sharp Kabushiki Kaisha (JP)

(*) Notice: Subject to any disclaimer, the term of this patent is extended or adjusted under 35 U.S.C. 154(b) by 4 days.

This patent is subject to a terminal disclaimer.

(21) Appl. No.: 10/291,081

(22) Filed: Nov. 8, 2002

(65) Prior Publication Data

US 2003/0075761 A1 Apr. 24, 2003

Related U.S. Application Data

(63) Continuation of application No. 09/800,147, filed on Mar. 6, 2001, now Pat. No. 6,492,681.

(30) Foreign Application Priority Data

Mar. 8, 2000 (JP) ........................ 2000-062908

(51) Int. Cl.[7] .......................... H01L 27/01; H01L 27/12
(52) U.S. Cl. ....................... 257/347; 257/349
(58) Field of Search ................. 257/347, 349

(56) References Cited

U.S. PATENT DOCUMENTS

| | | | |
|---|---|---|---|
| 5,643,826 A | 7/1997 | Ohtani et al. | 437/88 |
| 5,923,962 A | 7/1999 | Ohtani et al. | 438/150 |
| 6,096,581 A | 8/2000 | Zhang et al. | 438/149 |
| 6,461,899 B1 * | 10/2002 | Kitakado et al. | 438/149 |

FOREIGN PATENT DOCUMENTS

| JP | 7-130652 | 5/1995 |
|---|---|---|
| JP | 2001-015764 | 1/2001 |

OTHER PUBLICATIONS

English abstract re Japanese patent application No. 7–130652, published May 19, 1995.

U.S. patent application No. 09/558,736 (pending) to Kitado et al, filed Apr. 26, 2000, including specification, claims, abstract, drawings and PTO filing receipt.

* cited by examiner

Primary Examiner—Amir Zarabian
Assistant Examiner—Kiesha Rose
(74) Attorney, Agent, or Firm—Cook, Alex, McFarron, Manzo, Cummings & Mehler, Ltd.

(57) ABSTRACT

The present invention has provided on a back channel side of the TFT a blocking layer that is formed by laminating a 50 nm to 100 nm thick silicon oxynitride film (A) and a 30 nm to 70 nm thick silicon oxynitride film (B). By forming a lamination structure of such silicon oxynitride films, not only can be the contaminations caused by impurities such as alkali metallic elements from the substrate prevented, but the fluctuations in the electrical characteristics of the TFT can be reduced.

40 Claims, 17 Drawing Sheets

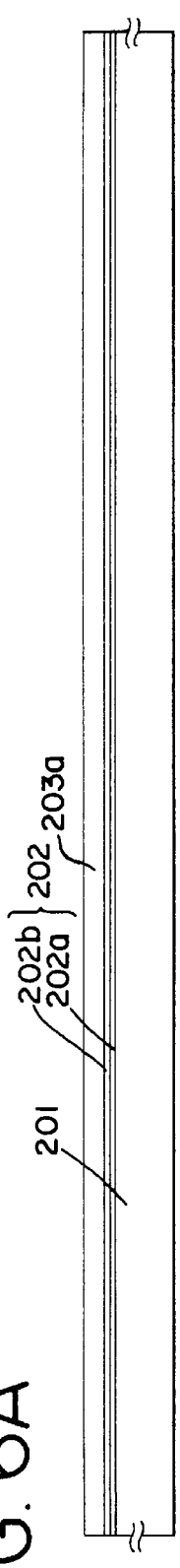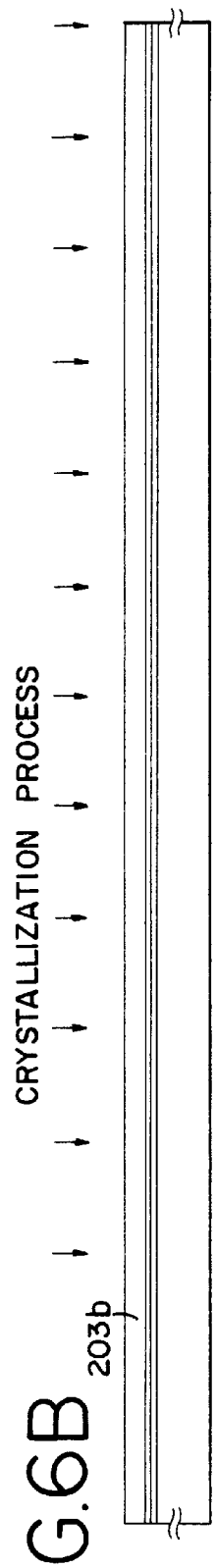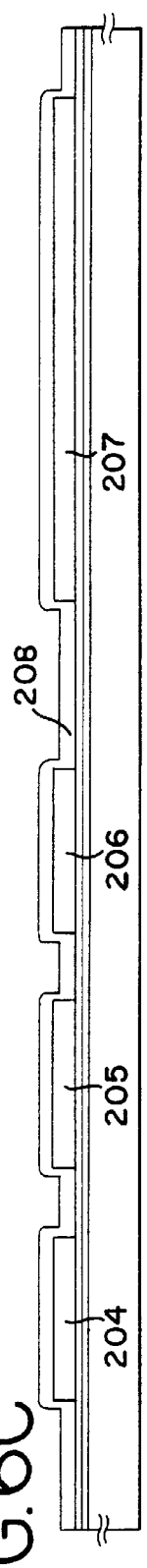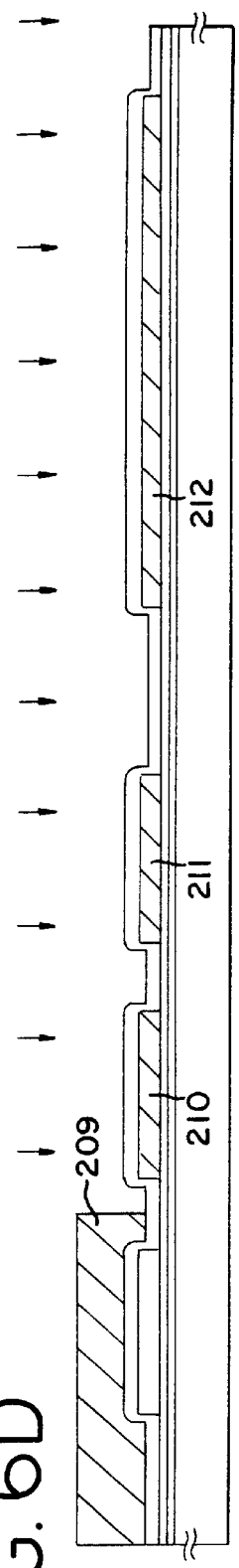

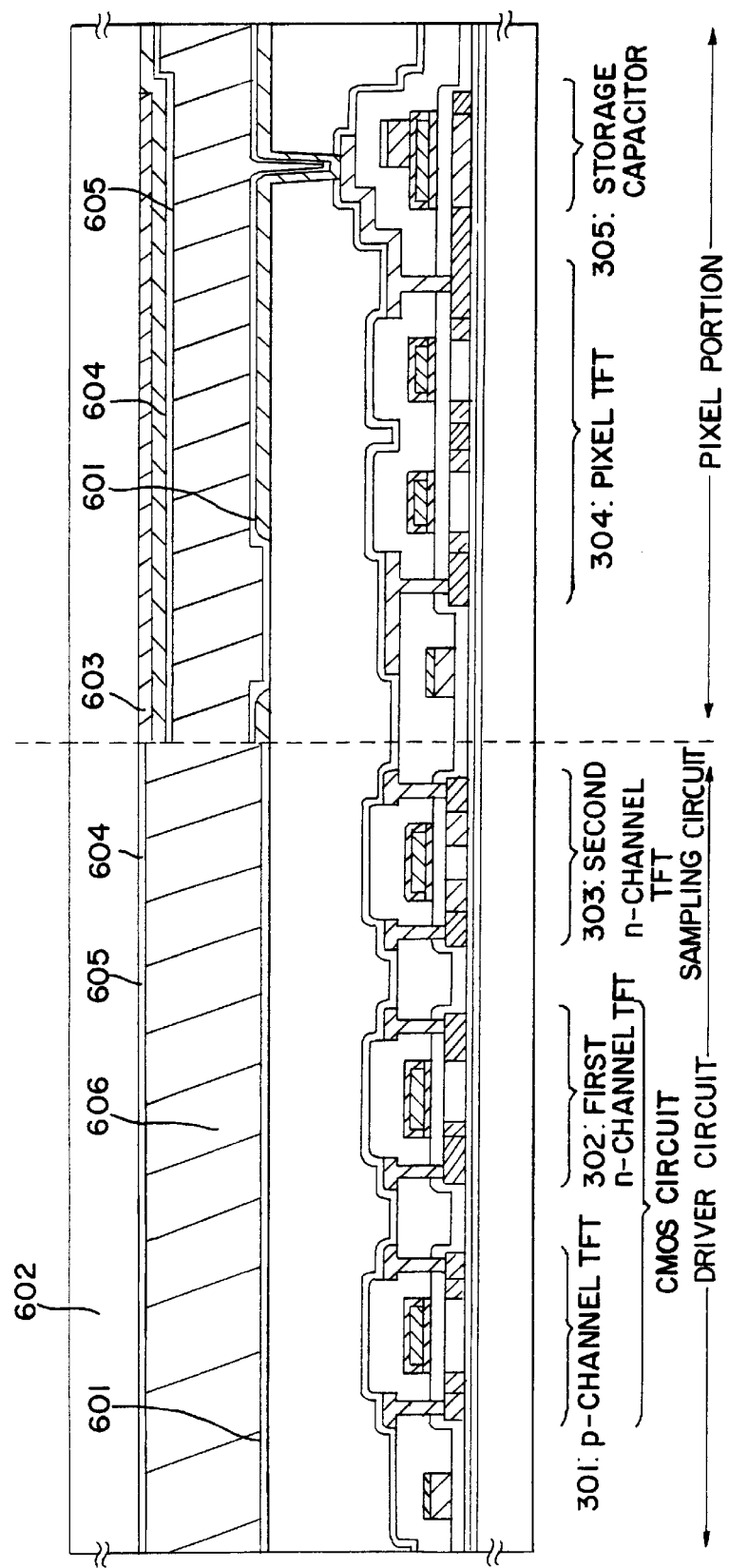

SEMICONDUCTOR DEVICE

This application is a continuation of copending U.S. application Ser. No. 09/800,147, filed on Mar. 6, 2001.

BACKGROUND OF THE INVENTION

1. Field of the Invention

The present invention relates to a thin film transistor (hereinafter referred to as TFT) formed on a substrate and to an electronic device using the TFT. In particular, the present invention relates to an insulating film that is provided between a substrate and a semiconductor layer serving as an active layer of a TFT. Such an insulating layer, which is referred to as a blocking layer or a base film, is employed for the purpose of preventing the active layer from being contaminated by an impurity such as an alkali metallic element that is in the substrate. Together with preventing the reduction in the reliability and the deterioration of the TFT that are caused by the contamination of the active layer, the present invention relates to a structure of the insulating film that is suitable for obtaining a TFT having good characteristics and small fluctuations within the substrate.

Typically, a liquid crystal display device may be cited as the electronic device of the present invention. It is to be noted that a semiconductor device as used herein throughout the specification refers to any device which functions by utilizing semiconductor characteristics, and the above-mentioned TFT, the electronic device and electronic equipment having the electronic device mounted therein as a display portion are included in semiconductor devices.

2. Description of the Related Art

In recent years, an active matrix type display device that utilizes a TFT, which has an active layer formed of a crystalline semiconductor layer, as switching elements of pixels and driver circuits is attracting much attention as a means of realizing an incredibly fine and high quality image display. A crystalline silicon layer formed of an amorphous silicon layer that is crystallized by a known method such as laser annealing or thermal annealing may be suitably used as a material of the crystalline semiconductor layer. In the TFTs using the crystalline silicon layer, an electric field effect mobility is high and because a high current driving ability can be attained even if fine processing is performed, it is possible to increase an aperture ratio of a pixel portion.

A quartz glass substrate that does not contain alkali oxide therein and a low alkali glass substrate that contains alkali oxide therein can be used as the substrate of such an active matrix type display device. However, it is preferable that an inexpensive low alkali glass substrate is used rather than the quartz glass substrate in order to realize a low price active matrix type display device. However, in the case of using the low alkali glass substrate as the substrate, the highest temperature in the manufacturing process thereof must be at between 600° C. and 700° C. in terms of the heat resistance of the glass substrate.

Further, it was necessary to at least form a blocking layer that is made of a silicon oxide film or a silicon nitride film on the side of the surface of the glass substrate on which the TFT will be formed such that a small amount of alkali metal such as sodium (Na) that is contained in the substrate will not mix into the active layer of the TFT. Known structures of TFTs formed on the glass substrate are the top gate type and the bottom gate type (or inverted stagger type). The top gate type has a structure in which at least a gate insulating film and a gate electrode are provided on a surface that is the opposite side of the substrate side of the active layer. In this top gate type TFT, among the alkali metallic elements in the glass substrate, the ones that have been ionized are drawn to the side of the active layer depending on the polarity of the gate electrode when a voltage is applied thereto. Therefore, the blocking layer as mentioned above is formed on a surface that is opposite from the surface where the active layer is in contact with the gate insulating film (hereinafter referred to as back channel side throughout the present specification for the sake of convenience). If the quality of this blocking layer is poor, the alkali metallic elements in the glass substrate will easily mix into the active layer, whereby the electrical characteristic of the TFTs will change. Hence, reliability cannot be secured. In addition, if the blocking layer is provided and an amorphous semiconductor layer is formed thereon to thereby form a crystalline semiconductor layer by laser annealing or thermal annealing, then an internal stress of the blocking layer will change, causing the crystalline semiconductor layer to distort. Even if the TFT is completed under such conditions, the electrical characteristics of the TFT such as a threshold voltage (hereinafter abbreviated as Vth) and a subthreshold constant (hereinafter abbreviated as S-value and referred to as such) will vary from a target value.

Therefore, it is disclosed in Japanese Patent Application No. Hei 11-125392 that a blocking layer made of a lamination of a silicon oxynitride film (A) and a silicon oxynitride film (B) is provided on the back channel side of the TFT to thereby prevent contaminations caused by impurities such as the alkali metallic elements from the substrate. In addition, an appropriate range of the composition and the film thickness of the first layer silicon oxynitride film (A) and the second layer silicon oxynitride film (B) such that the internal stress becomes small before and after the crystallization process of the amorphous semiconductor layer, that is, influences to the crystalline semiconductor layer will be small, is disclosed in the above mentioned application.

The oxygen concentration contained in the silicon oxynitride film (A) is set to between 20 atomic % and 30 atomic %, and the nitrogen concentration is set to between 20 atomic % and 30 atomic %, or the composition ratio of nitrogen to oxygen is set to between 0.6 and 1.5. Furthermore, the oxygen concentration contained in the silicon oxynitride film (B) is set to between 55 atomic % and 65 atomic %, and the nitrogen concentration is set to between 1 atomic % and 20 atomic %, or the composition ratio of nitrogen to oxygen is set to between 0.01 and 0.4. The hydrogen concentration of the silicon oxynitride film (A) is set to between 10 atomic % and 20 atomic %, or the composition ratio of hydrogen to oxygen is set to between 0.3 and 1.5, and the hydrogen concentration of the silicon oxynitride film (B) is set to between 0.1 atomic % and 10 atomic %, or the composition ratio of hydrogen to oxygen is set to between 0.001 and 0.15.

Further, the density of the silicon oxynitride film (A) is set to between $8 \times 10^{22}$ atoms/cm$^3$ and $2 \times 10^{23}$ atoms/cm$^3$, and the density of the silicon oxynitride film (B) is set to between $6 \times 10^{22}$ atoms/cm$^3$ and $9 \times 10^{22}$ atoms/cm$^3$. The etching rate of a mixed aqueous solution containing 7.13% of ammonium hydrogen fluoride (NH$_4$HF$_2$) and 15.4% of ammonium fluoride (NH$_4$F) of such a silicon oxynitride film (A) at 20° C. is between 60 nm/min and 70 nm/min (after heat treatment at 500° C. for 1 hour, and heat treatment at 550° C. for 4 hours, the etching rate is between 40 nm/min and 50 nm/min). The etching rate of the silicon oxynitride film (B) is between 110 nm/min and 130 nm/min (after heat treatment at 500° C. for 1 hour, and heat treatment at 550° C. for 4 hours, the etching rate is between 90 nm/min and 100 nm/min). The etching rate defined here is a value obtained from performing etching at 20° C. with an aqueous solution containing 7.13% of $NH_4HF_2$ and 15.4% of $NH_4F$ as the etching solution.

By providing the silicon oxynitride film (A) in contact with the substrate at a thickness of between 10 nm and 150 nm, preferably between 20 nm and 60 nm and providing the silicon oxynitride film (B) thereon at a thickness of between 10 nm and 250 nm, preferably between 20 nm and 100 nm, the contamination of the active layer by impurities such as alkali metallic elements in the substrate can be prevented.

Furthermore, because the blocking layer is formed by laminating the silicon oxynitride film (A) and the silicon oxynitride film (B), it is preferable that, taking into consideration the internal stress of the blocking layer under the laminated state, the changing amount of the internal stress thereof before and after the crystallization process is $1 \times 10^2$ $N/m^2$ or less.

The manufacturing method of the silicon oxynitride films at this point may he formed by known a film deposition method such as plasma CVD, low pressure CVD or ECR-CVD. Particularly, it is preferable that plasma CVD is used to form the silicon oxynitride films. Further, $SiH_4$, $NH_3$, and $N_2O$ are used as the raw gas. The composition ratio is realized by controlling the supplying amount of the raw gas, or adjusting parameters such as reaction pressure, discharge power, discharge frequency, and substrate temperature that are related to the film deposition of the silicon oxynitride films. NH is a supplement for the nitriding of the silicon oxynitride film. The amount of nitrogen contained in the silicon oxynitride film can be effectively controlled by appropriately adjusting the supplying amount of $NH_3$. Therefore, compared with the silicon oxynitride film (B), the silicon oxynitride film (A) having a high concentration of nitrogen is formed from $SiH_4$, $NH_3$, and $N_2O$ whereas the silicon oxynitride film (B) is formed from $SiH_4$ and $N_2O$.

By forming the blocking layer based on the composition and the film thickness of the silicon oxynitride film (A) and the silicon oxynitride film (B) as mentioned above, contamination by the alkali metallic elements from the substrate can be prevented. Thus, the internal stress of the blocking layer can be made small before and after the crystallization process of the amorphous semiconductor layer and influences to the crystalline semiconductor layer can be lessened. Consequently, the electrical characteristics of the TFTs such as the Vth and the S-value become the target value, whereby highly reliable TFTs can be manufactured.

The above-mentioned Vth, which is a typical parameter of the electrical characteristic of TFTs, in the characteristic of the ½ power of a drain current (hereinafter referred to as Id) versus a gate voltage (hereinafter referred to as Vg), can be obtained as a voltage value that intersects a Vg axis by extrapolating a linear region. Also, the relationship between the drain current and the gate voltage in the vicinity of the Vth or less is called the subthreshold characteristic, which is a very important characteristic for determining the performance of the TFT as a switching-element. The S-value is used as a constant for expressing the goodness of the subthreshold characteristic. Further, the S-value is defined as the gate voltage that is required for the drain current to make a 1 line change when the subthreshold characteristic is plotted to a single logarithm graph.

For the value of the Vth to operate a circuit, an N channel TFT may be set to between 0.5 V and 2.5 V, and a P channel TFT may be set to between −2.5 V and −0.5 V. It is to be noted that a method of doping an impurity element that imparts a p-type conductivity into a channel forming region of the active layer at a concentration of about $1 \times 10^{16}$ $atoms/cm^3$ to $5 \times 10^{17}$ $atoms/cm^3$ is taken in order to control the Vth. Such measure is called a channel doping and is a crucial process for attaining a switching characteristic of the TFTs according to the design.

In addition, the smaller the S-value is, the width of the voltage that is necessary for switching between the ON state and the OFF state of the TFTs can be small, thereby making it possible for the TFTs to operate rapidly and at a low consumption power.

Fluctuations of the values of the electrical characteristics of the TFTs such as the Vth and the S-value may be seen in the TFTs inside the surface of the substrate. As the fluctuations of these characteristic values become large, then a large margin of the gate voltage must be taken. As a result, the voltage that is necessary for operation becomes high, thereby increasing the consumption power. Further, the values of the Vth and the S-value remarkably influence the reproductivity of the gradation display of a liquid crystal display device, particularly the reproductivity of an intermediate color. Therefore, if these values fluctuate, then the original display contents cannot be genuinely reproduced when displayed, and an inconsistent display may be recognized.

SUMMARY OF THE INVENTION

The present invention has been made in view of the above problem, and therefore has an object to provide a TFT that has a small fluctuation in a typified characteristic of the TFT and a method of manufacturing the same to thereby provide an active matrix type liquid crystal display device employing such a TFT.

For the purpose of resolving the above problem., the present inventor conducted many experiments regarding the relationship between the fluctuations of the electrical characteristics of the TFT typified by the Vth and the S-value and the processes necessary for manufacturing the TFT. The conclusion after many trials and errors was that in the above-mentioned structure, which has the provision of a blocking layer formed by laminating a silicon oxynitride film (A) and a silicon oxynitride film (B) on the side of a back channel, the present inventor discovered that there was a close relationship between the fluctuations of the electrical characteristics of the TFT and the structure of the blocking layer.

Furthermore, in the above-mentioned structure having the provision of the blocking layer formed by laminating the silicon oxynitride film (A) and the silicon oxynitride (B) on the side of the back channel, the present inventor discovered, upon proceeding with the experiments, that the fluctuations of the electrical characteristics of the TFT are influenced more by the film thickness, the quality of the film, and the film uniformity of the silicon oxynitride film (B) than by those of the silicon oxynitride film (A).

In regards to evaluating the fluctuation of the electrical characteristics of the TFT, attention is directed to the characteristic for normal operating a circuit that is formed of a TFT at a desirable driving voltage, that is, the values of Vth. S-value, and electric field effect mobility. Therefore, attention is particularly directed to the values of Vth and S-value here. Shown in FIGS. 1 and 2 is the influence of the film thickness of the silicon oxynitride film (B) imparted to the fluctuation of the Vth and the S-value. FIG. 1 shows the fluctuation of the Vth and FIG. 2 shows the fluctuation of the S-value. The shape of each of the plots indicates the film thickness of the silicon oxynitride film (B), where the plot denoted by ○ is 30 nm, the plot denoted by Δ is 50 nm, and the plot denoted by □ is 100 nm. As shown in the figures, as the slope of the straight line formed by each of the plots becomes larger, the fluctuations of the respective values become smaller. For example, it is apparent from FIG. 1 that the fluctuation of the Vth becomes larger as the film thickness of the silicon oxynitride film (B) sequentially becomes 50 nm, 30 nm, and 100 nm. 99% of the Vth value of a TFT is in the range of −1.78 V to −1.59 V when the film thickness of the silicon oxynitride film (B) is 50 nm, fluctuation is in the range of −1.77 V to −1.46 V when the film thickness thereof is 30 nm, and fluctuation is in the range of −2.51 V and −1.82 V when the film thickness thereof is 100 nm. In addition, when the film thickness of the silicon oxynitride film (B) is 50 nm, it is also apparent that 99% of the Vth value of the TFT is held within a width of 0.19 V, that is, a value obtained by subtracting −1.78 V from −1.59 V. The Vth value thus obtained is referred as the 99% fluctuation width of Vth. It is to be noted that the film thickness of the silicon oxynitride film (A) is all 50 nm. Thus, the fluctuation was evaluated by measuring 100 P channel TFTs of the same size dispersed at approximately equal intervals in a 10 cm×10 cm substrate.

Shown in FIG. 3 is the relationship between the 99% fluctuation width of Vth and the film thickness of the silicon oxynitride film (B). Compared with the case where the film thickness of the silicon oxynitride film (B) is 100 nm, the fluctuation of the electrical characteristics of the TFT has become remarkably smaller when the film thickness thereof thinner, that is, 50 nm. Further, when the film thickness of the silicon oxynitride film (B) is 30 nm, the fluctuation of the electrical characteristics is smaller when compared with the 100 nm thick silicon oxynitride film (B) but somewhat larger when the film thickness thereof is 50 nm. Therefore, it can be discerned that the fluctuation of the electrical characteristics of the TFT has become effectively smaller by making the film thickness of the silicon oxynitride film (B) thinner from 100 nm to 50 nm. However, it can also be discerned that when the film thickness thereof is further made thinner from 50 nm to 30 nm, the uniformity of the film quality is reduced, resulting in making the fluctuation larger.

Therefore, in order to effectively make the fluctuation of the electrical characteristic of the TFT smaller, it is appropriate to form on a 10 cm×10 cm substrate the silicon oxynitride film (B) whose film thickness is between 30 nm and 70 nm, preferably 50 nm, that is, a film thickness where the 99% fluctuation width of Vth is within approximately 0.3 V.

On the other hand, as the film thickness of the silicon oxynitride film (A) is made thicker, the effect of preventing contamination from the substrate becomes higher. However, if the film thickness of the silicon oxynitride film (A) is thicker than 100 nm, there are cases where an amorphous silicon film that will be formed thereon peels off. In addition, it has been confirmed that the effect of the, silicon oxynitride film (A) in preventing contamination by alkali metallic elements is sufficient, even when the film thickness thereof is at 50 nm. Therefore, the film thickness of the silicon oxynitride film (A) is preferable between 50 nm and 100 nm. Thus, there is an optimal range for the film thickness and film quality of the blocking film that uses the silicon oxynitride film provided on the side of the back channel, and by adopting an appropriate combination thereof, not only can the characteristic of the TFT be stabilized but the fluctuation in the Vth and the S-value can be reduced. As a result, the driving voltage of the liquid crystal display device can be reduced, whereby the consumption power is also reduced, and the reproductivity of the gradation display of the liquid crystal display device can be further enhanced.

BRIEF DESCRIPTION OF THE DRAWINGS

The above and other objects and features of the present invention will be more apparent from the following description taken in conjunction with the accompanying drawings:

FIGS. 6A to 6D are cross-sectional views showing a process of manufacturing a TFT in accordance with Embodiment 1 of the present invention;

FIG. 15 is a cross-sectional view showing the structure of a liquid crystal display device in accordance with Embodiment 2 of the present invention;

DETAILED DESCRIPTION OF THE PREFERRED EMBODIMENTS

Embodiment Mode 1

Manufacturing processes of a CMOS circuit formed of an N channel TFT and a P channel TFT will be explained in Embodiment Mode 1 of the present invention with reference to FIGS. 4A to 4F and FIGS. 5A to 5F. A method of manufacturing on the same substrate the N channel TFT and the P channel TFT that are necessary for forming the CMOS circuit will be explained in detail here in accordance with the processes. Further, the composition and the structure of a blocking layer for making the fluctuation of Vth and S-value of the TFT are made apparent here in Embodiment Mode 1.

Figure 4A:
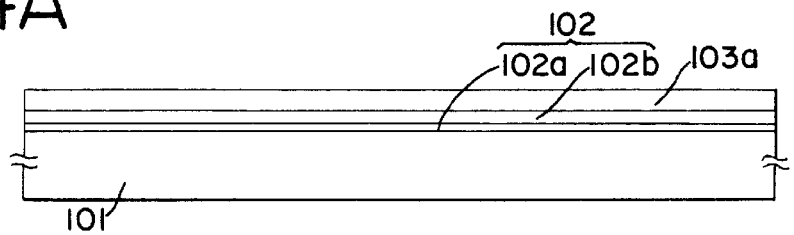
FIGS. 4A to 4F are views showing a process of manufacturing a TFT in accordance with Embodiment Mode 1 of the present invention.

<Formation of the Blocking Layer and the Amorphous Semiconductor Layer: FIG. 4A>

In FIG. 4A, a substrate such as a barium borosilicate glass substrate or alumino borosilicate glass substrate typified by Corning Corp. #7059 glass or #1737 glass substrate, which is generally referred to as a low alkali glass or a non-alkali glass, is used for a substrate 101. Alkali metallic elements such as sodium are contained in this type of glass substrate, although at trace amounts. It is to be noted that heat treatment may be performed on the substrate 101 in advance at a temperature lower than the distortion point of the glass by approximately 10° C. to 20° C.

A blocking layer 102 is formed on the side of the surface of the substrate 101 on which the TFT will be formed, in order to prevent contamination by the above-mentioned alkali metallic elements and other impurities from the substrate 101. The blocking layer 102 is formed of a silicon oxynitride film (A) 102a made from $SiH_4$, $NH_3$, and $N_2O$, and of a silicon oxynitride film (B) 102b made from $SiH_4$ and $N_2O$. The silicon oxynitride film (A) 102a is formed to a thickness of 50 nm to 100 nm, and the silicon oxynitride film (B) 102b is formed to a thickness of 30 nm to 70 nm (preferably 50 nm). In Embodiment Mode 1 of the present invention, the silicon oxynitride film (A) 102a is formed to a thickness of 50 nm and the silicon oxynitride film (B) 102b is formed to a thickness of 50 nm. By forming the blocking layer with such a structure, not only is the contamination by the alkali metallic elements and other impurities prevented, but the fluctuations of the electrical characteristics of the TFT can be reduced.

The silicon oxynitride film (A) 102a and the silicon oxynitride film (B) 102b may be formed by using known film deposition methods. However, it is preferable that plasma CVD is used. The typical manufacturing conditions at that point are shown in Table 1.

TABLE 1

|  |  | silicon oxynitride film (A) | silicon oxynitride film (B) | silicon oxynitride film (C) |
|---|---|---|---|---|
| film forming temperature (° C.) |  | 400 | 400 | 400 |
| gas flow rate (SCCM) | $SiH_4$ | 10 | 4 | 10 |
|  | $N_2O$ | 20 | 400 | 700 |
|  | $NH_3$ | 100 | 0 | 0 |
| pressure (Pa) |  | 40 | 40 | 93 |
| electric discharge power density (W/cm²) |  | 0.41 | 0.41 | 0.12 |
| electric discharge frequency (MHz) |  | 60 | 60 | 13.56 |

Further, manufacturing conditions suitable to be used for an interlayer insulating film are shown in Table 1 as a comparison and serves as the conditions for a silicon oxynitride film (C). The respective gas flow rate ratios are set according to the conditions shown in Table 1. As for the other manufacturing conditions, for the silicon oxynitride film (A), the substrate temperature is set to 325° C., the reaction pressure is set to 40 Pa, the electric discharge power density is set to 0.41 W/cm², and the electric discharge frequency is set to 60 MHz. The other manufacturing conditions of the silicon oxynitride film (B) are set similar to those of the silicon oxynitride film (A) except for the gas flow rate ratio, and the substrate temperature is set to 400° C. With respect to the silicon oxynitride film (C), the gas flow rate ratio is set different from that of the silicon oxynitride film (B), and furthermore the reaction pressure is set to 93 Pa, the electric discharge power density is set to 0.12 W/cm², and the electric discharge frequency is set to 13.56 MHz.

The various characteristics of the silicon oxynitride films (A) to (C) formed under such conditions are compiled and shown in Table 2.

TABLE 2

|  |  |  | silicon oxynitride film (A) | silicon oxynitride film (B) | silicon oxynitride film (C) |
|---|---|---|---|---|---|
| composition (atomic %) | H |  | 16.5 | 1.5 | — |
|  | N |  | 24 | 7 | — |
|  | O |  | 26.5 | 59.5 | — |
|  | Si |  | 33 | 32 | — |
| density (atoms/cm³) |  |  | $9.28 \times 10^{22}$ | $7.08 \times 10^{22}$ | — |
| hydrogen concentration (atomic/cm³) | NH | as-depo | $8.09 \times 10^{21}$ | $5.46 \times 10^{20}$ | $8.86 \times 10^{20}$ |
|  |  | annealed | $7.42 \times 10^{21}$ | $2.06 \times 10^{20}$ | — |
|  | SiH | as-depo | $8.74 \times 10^{20}$ | — | — |
|  |  | annealed | $2.18 \times 10^{20}$ | — | — |
| wet etching speed (nm/min) |  | as-depo | 63 | 120 | 200 |
|  |  | annealed | 44 | 96 | 130 |

TABLE 2-continued

|  |  | silicon oxynitride film (A) | silicon oxynitride film (B) | silicon oxynitride film (C) |
| --- | --- | --- | --- | --- |
| internal stress (dynes/cm$^2$) | as-depo | 8.07 × 10$^9$ | (−4.26 × 10$^9$) | (−2.00 × 10$^9$) |
|  | annealed | 7.42 × 10$^{10}$ | (−7.29 × 10$^7$) | (−1.30 × 10$^9$) |

The composition ratios and densities of hydrogen (H), nitrogen (N), oxygen (O) and silicon (Si) obtained from Rutherford Backscatting Spectrometry (hereinafter abbreviated as RBS; device used system; 3S-R10, accelerator; NEC3SDH pelletron end station; CE&A RBS-400), the densities of N—H coupling and Si—H coupling obtained from Fourier Transform Infrared Spectroscopy (hereinafter abbreviated as FT-IR; the device used is Nicolet Magna-IR 760), the etching rate at 20° C. in a mixed solution containing 7.13% of ammonium hydrogen fluoride (NH$_4$HF$_2$) and 15.4% of ammonium fluoride (NH$_4$F) (Stella Chemifa Corp; product name LAL500), and the amount of change of the internal stress by thermal annealing are shown in Table 2. The measuring instrument, Model-30114 manufactured by Ionic System Corp., is used as the measuring instrument of the internal stress. A sample manufactured on a silicon wafer substrate was measured. The symbol (−) of the notation of the internal stress signifies a tensile stress (stress that deforms the film inwards), and the symbol (+) signifies a compressive stress (stress that deforms the film outwards).

The composition ratio of nitrogen to oxygen in the silicon oxynitride film (A) is 0.91. Compared with the composition ratio of 0.12 of the silicon oxynitride film (B), a condition was made in which the proportion of nitrogen contained therein was set higher. At this point, the composition ratio of hydrogen to oxygen in the silicon oxynitride film (A) became 0.62 and the composition ratio of hydrogen to oxygen in the silicon oxynitride film (B) was 0.03. As a result, the density of the films become higher, whereby the wet etching rate of the silicon oxynitride film (A) became 44 nm/min (after thermal annealing) compared with that of the silicon oxynitride film (B), which was 96 nm/min (after thermal annealing). Thus, it can be surmised that the silicon oxynitride film (A) is a densified film from the fact that the wet etching rate slows down. Comparing based on the wet etching rate, it can be surmised that the silicon oxynitride film (C) has a faster wet etching rate than the silicon oxynitride film (B) and is a film having very small density.

Of course, the manufacturing conditions of the silicon oxynitride films are not limited to the conditions shown in Table 1. The silicon oxynitride film (A) may be manufactured by using SiH$_4$, NH$_3$, and N$_2$O, employing a substrate temperature on the order of 250° C. to 450° C., a reaction pressure of between 10 Pa and 100 Pa, and a power source frequency of 13.56 MHz or more, and setting the electric discharge power density to between 0.15 W/cm$^2$ and 0.80 W/cm$^2$ so that the hydrogen concentration is between 10 atomic % and 20 atomic %, the nitrogen concentration is between 20 atomic % and 30 atomic %, the oxygen concentration is between 20 atomic % and 30 atomic %, the density is between 8×10$^{22}$ atoms/cm$^3$ and 2×10$^{23}$ atoms/cm$^3$, and the etching rate in the above-mentioned mixed solution containing 7.13% of ammonium hydrogen fluoride (NH$_4$HF$_2$) and 15.4% of ammonium fluoride (NH$_4$F) is between 40 nm/min and 70 nm/min. On the other hand, the silicon oxynitride film (B) may be manufactured by using SiH$_4$ and N$_2$O, employing a substrate temperature on the order of 250° C. to 450° C., a reaction pressure of between 10 Pa and 100 Pa, and a power source frequency of 13.56 MHz or more, and setting the electric discharge power density to between 0.15 W/cm$^2$ and 0.80 W/cm$^2$ so that the hydrogen concentration is between 0.1 atomic % and 10 atomic %, the nitrogen concentration is between 1 atomic % and 20 atomic %, the oxygen concentration is between 55 atomic % and 65 atomic %, the density is between 6×10$^{22}$ atoms/cm$^3$ and 9×10$^{22}$ atoms/cm$^3$, and the etching rate in the above-mentioned mixed solution containing 7.13% of ammonium hydrogen fluoride (NH$_4$HF$_2$) and 15.4% of ammonium fluoride (NH$_4$F) is between 90 nm/min and 130 nm/min.

Further, a value after depositing the films (as-depo) and a value after applying heat treatment (conducted at a temperature of 500° C. for 1 hour+550° C. for 4 hours, same as the process conditions in the crystallization process) thereto (annealed) in regard to the coupling hydrogen amount, the wet etching rate, and the internal stress are also shown in Table 2. As is apparent from the characteristics of Table 2, hydrogen is released from the silicon-oxynitride films by the heat treatment and the films are densified, whereby the tensile stress thereof changes in the direction of becoming big.

A semiconductor layer 103a having an amorphous structure is formed next to a thickness of 25 nm to 80 nm (preferably between 30 nm and 60 nm) by a known method such as plasma CVD or sputtering. A 54 nm thick amorphous silicon film is formed by plasma CVD in Embodiment Mode 1. An amorphous semiconductor film and a microcrystalline semiconductor film exist as the semiconductor film having an amorphous structure, and a compound semiconductor film having an amorphous structure, such as an amorphous silicon germanium film, may also be applied. Furthermore, both the blocking layer 102 and the amorphous semiconductor layer 103a may be formed in succession. For example, after forming the blocking layer 102b by plasma CVD, if the reaction gasses are changed from SiH$_4$ and N$_2$O to SiH$_4$ and H$_2$, or to SiH$_4$ only, then the films can be formed successively without once being exposed to the atmosphere. As a result, it becomes possible to prevent contamination of the surface of the blocking layer 102b, and fluctuations in the characteristics of the TFT to be manufactured, that is, change in the threshold voltage thereof can be reduced.

Figure 4B:
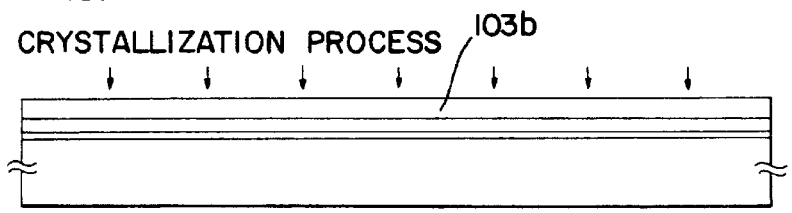

<Crystallization Process: FIG. 4B>

Then a crystalline semiconductor layer 103b is formed of the amorphous semiconductor layer 103a by using a known crystallization technique. For example, laser annealing and thermal annealing (solid phase growth methods), and rapid thermal annealing (RTA) are applicable. In the RTA method, a lamp such as an infrared lamp, a halogen lamp, a metal halide lamp, or a xenon lamp is used as a light source. Alternatively, the crystalline semiconductor layer 103b can be formed by a crystallization method using a catalytic element in accordance with the technique disclosed in Japanese Patent Application Laid-open No. Hei 7-130652.

In the crystallization process, it is essential to drive out the hydrogen contained in the amorphous semiconductor layer. Therefore, it is desirable that heat treatment is performed first for approximately 1 hour at between 400° C. and 500° C., to thereby reduce the amount of hydrogen contained in the amorphous semiconductor layer to 5 atomic % or less, and then crystallization is performed.

In the case of performing crystallization by laser annealing, an excimer laser of a pulse oscillation type or a continuous light emitting type, or an argon laser is used as the light source. When using the pulse oscillation type excimer laser, then laser annealing is performed after processing the laser light into a linear shape. The laser annealing conditions are suitably chosen by the operator, and for example, are set as follows: a laser pulse oscillation frequency of 30 Hz and a laser energy density of between 100 mJ/cm$^2$ and 500 mJ/cm$^2$ (typically between 300 mJ/cm$^2$ and 400 mJ/cm$^2$). The linear beam is then irradiated over the entire face of the substrate, and irradiation is performed such that the overlap ratio of the linear beam at this point is between 80% and 98%. The crystalline semiconductor layer can thus be formed.

In the case of thermal annealing, the furnace annealing method is employed to perform annealing under a nitrogen atmosphere at a temperature of about 600° C. to 660° C. Whichever method is used, realignment of atoms occurs during the crystallization of the amorphous semiconductor layer, making the layer fine. Therefore, the thickness of the crystalline semiconductor layer 103$a$ manufactured is reduced by about 1% to 15% compared with the thickness of the original amorphous semiconductor layer 103$b$ (54 nm in Embodiment Mode 1).

Figure 4C:
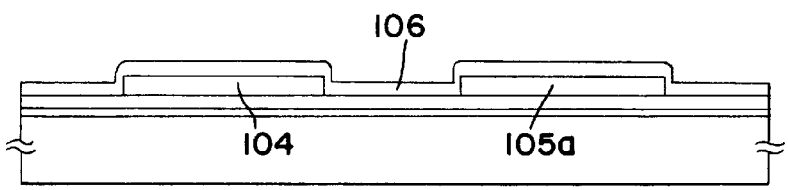

<Formation of the Island-Like Semiconductor Layer and the Mask Layer: FIG. 4C>

A photoresist pattern is then formed on the crystalline semiconductor layer 103$b$, and the crystalline semiconductor layer is partitioned into island-like shapes by dry etching to thereby form island-like semiconductor layers 104 and 105$a$ as active layers. A mixed gas of $CF_4$ and $O_2$ is used in dry etching. A mask layer 106 is then formed of a silicon oxide film to a thickness of 50 nm to 100 nm by plasma CVD, decompression CVD, or sputtering. For example, if plasma CVD is used, tetraethyl orthosilicate (TEOS) and $O_2$ are mixed, the reaction pressure is set to 40 Pa, the substrate temperature is set between 300° C. and 400° C., and electric discharge is conducted at a high frequency (13.56 MHz) and power density of 0.5 W/cm$^2$ to 0.8 W/cm$^2$, forming the mask layer 106 to a thickness of 100 nm to 150 nm, typically 130 nm.

Figure 4D:
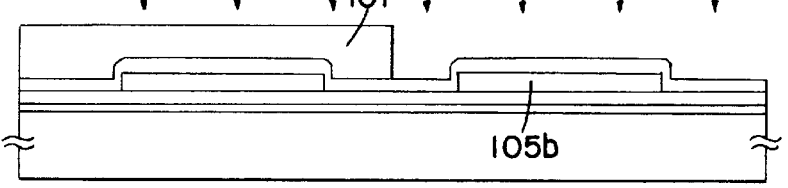

<Channel Doping Process: FIG. 4D>

A photoresist mask 107 is then formed, and an impurity element that imparts p-type conductivity is doped into the island-like semiconductor layer 105$a$, which forms the N channel TFT, at a concentration of $1\times10^{16}$ atoms/cm$^3$ to $5\times10^{17}$ atoms/cm$^3$ for the purpose of controlling the threshold voltage. In the periodic table, Group 13 elements such as boron (B), aluminum (Al), and gallium (Ga) are known as impurity elements that impart p-type conductivity to a semiconductor. Boron (B) is doped here by ion doping using diborane ($B_2H_6$). Boron (B) doping is not always necessary and there is no obstacle in omitting it, but the boron (B) doped semiconductor layer 105$b$ can be formed in order to place the threshold voltage of the N channel TFT within a predetermined range.

Figure 4E:
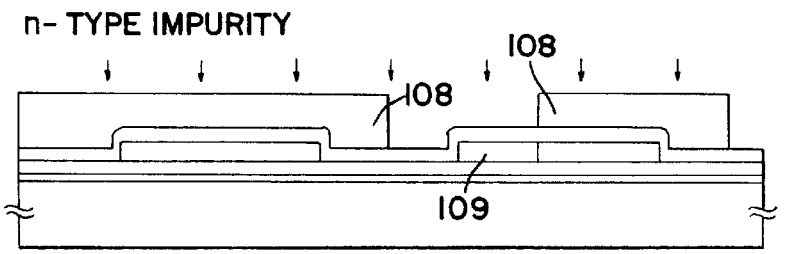

<n$^-$ Doping Process: FIG. 4E>

In order to form an LDD region of the N channel TFT, an impurity element that imparts n-type conductivity is selectively doped into the island-like semiconductor layer 105$b$. Periodic table Group 15 elements such as phosphorus (P), arsenic (As), and antimony (Sb) are known as impurity elements that impart n-type conductivity to a semiconductor. A photoresist mask 108 is formed, and ion doping using phosphine ($PH_3$) is applied here for doping phosphorus (P). The concentration of phosphorus (P) in an impurity region 109 formed is in the range of $2\times10^{16}$ atoms/cm$^3$ to $5\times10^{19}$ atoms/cm$^3$. The concentration of the impurity element that imparts n-type conductivity, which is contained in the impurity region 109, is referred to as (n$^-$) throughout this specification.

Figure 4F:
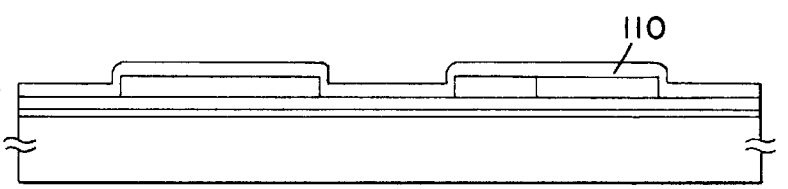

<Removal of the Mask Layer and Formation of the Gate Insulating Film: FIG. 4F>

The mask layer 106 is next removed by using an etching solution such as hydrofluoric acid diluted by pure water. Next, a gate insulating film 110 is formed from an insulating film containing silicon to a thickness of between 40 nm and 150 nm by using plasma CVD or sputtering. For example, the gate insulating film 110 may be formed of the silicon oxynitride film (B) to a thickness of 95 nm. Other insulating films containing silicon formed into a single layer or a lamination structure may also be used as the gate insulating film 110.

Figure 5A:
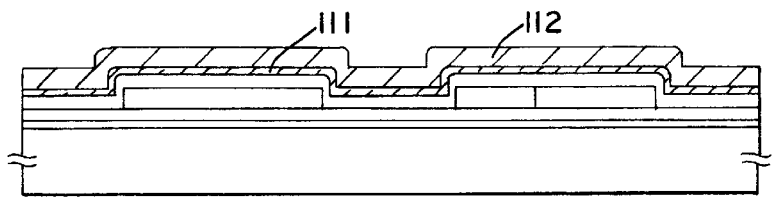
FIGS. 5A to 5F are views showing a process of manufacturing a TFT in accordance with Embodiment Mode 1 of the present invention.

<Formation of the First Conductive Layer: FIG. 5A>

A conductive layer is formed on the gate insulating film 10 in order to form a gate electrode. The conductive layer may be formed of a single layer, but a laminate structure of two layers or three layers can also be formed when necessary. In Embodiment Mode 1, a conductive layer (A) 111 made of a conductive metallic nitride film and a conductive layer (B) 112 made of a metallic film are laminated. The conductive layer (B) 112 may be formed from an element selected from the group consisting of tantalum (Ta), titanium (Ti), molybdenum (Mo), and tungsten (W), from an alloy having one of these element as its principal constituent, or from an alloy film of a combination of these elements (typically a Mo—W alloy film or a Mo—Ta alloy film). The conductive layer (A) 111 is formed from tantalum nitride (TaN), tungsten nitride (WN), titanium nitride (TiN), or molybdenum nitride (MoN). Further, tungsten suicide, titanium silicide, or molybdenum suicide is also applicable for forming the conductive layer (A) 111. The concentration of the impurities contained therein may be reduced in order to make the resistance of the conductive layer (B) 112 lower, and in particular, it is good to reduce the oxygen concentration to 30 ppm or less. For example, by reducing the oxygen concentration of tungsten (W) to 30 ppm or less, a resistivity value of 20 $\mu\Omega$cm or less can be realized.

The conductive layer (A) 111 may be formed to a thickness of between 10 nm and 50 nm (preferably between 20 nm and 30 nm), and the conductive layer (B) 112 may be formed to a thickness of between 200 nm and 400 nm (preferably between 250 nm and 350 nm). In Embodiment Mode 1, a 50 nm thick TaN film is used to form the conductive layer (A) 111, and a 350 nm thick Ta film is used to form the conductive layer (B) 112. Both the films are formed by sputtering. The TaN film is formed by using Ta as a target and a mixed gas of Ar and nitrogen as a sputtering gas. The Ta film is formed by using Ar as the sputtering gas. Further, if an appropriate amount of Xe or Kr is added to these sputtering gasses, then the internal stresses in the films to be formed can be relieved, and peeling can be prevented. The resistivity of the Ta film of an α-phase is about 20 $\mu\Omega$cm, and hence it can be suitably used in the gate electrode, but the Ta film of a β-phase has a resistivity of about 180 $\mu\Omega$cm, and therefore it is unsuitable for use as the gate electrode. The TaN film possesses a crystal structure which is close to the α-phase, and therefore the Ta film of the α-phase is easily obtained provided that the Ta film is formed on the TaN film. Note that although not shown in the figures, it is effective to form a silicon film that is doped with phosphorus (P) to a thickness of about 2 nm to 20 nm under the conductive layer (A) 111. By doing so, along with improving the adhesiveness and preventing oxidation of the conductive film formed on the silicon film, microscopic amounts of alkali metallic elements contained in the conductive layer (A) or in the conductive layer (B) can be prevented from diffusing into the gate insulating film 110. Whichever method is performed, it is preferable that the resistivity of the conductive layer (B) be in the range of 10 μΩcm to 500 μΩcm.

Figure 5B:
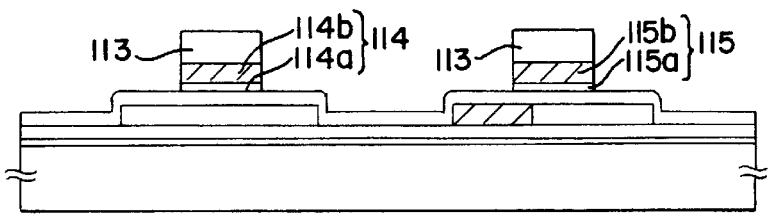

<Formation of the Gate Electrode: FIG. 5B>

Next, a photoresist mask 113 is formed, and the conductive layer (A) 111 and the conductive layer (B) 112 are etched together to thereby form gate electrodes 114 and 115. For example, etching can be performed by dry etching using a mixed gas of $CF_4$ and $O_2$, or using $Cl_2$ gas at a reaction pressure of between 1 Pa and 20 Pa. The gate electrodes 114 and 115 are formed integrally from conductive layers 114a and 115a, made from the conductive layer (A), and conductive layers 114b and 115b, made of the conductive layer (B), respectively. At this point, the gate electrode 115 of the N channel TFT is formed so as to overlap a portion of the impurity region 109 through the gate insulating film 110. Further, it is possible to form the gate electrode from only the conductive layer (B).

Figure 5C:
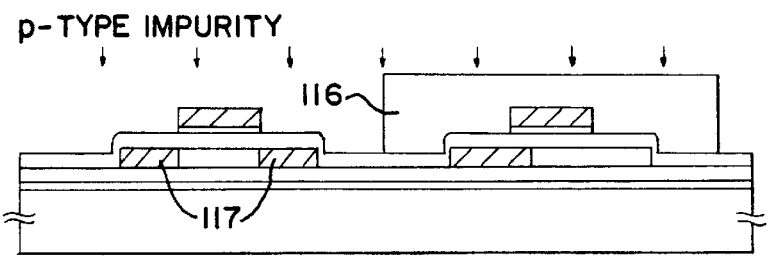

<$p^+$ Doping Process: FIG. 5C>

An impurity region 117 serving as a source region and a drain region of the P channel TFT is formed next. Here, an impurity element that imparts p-type conductivity is doped using the gate electrode 114 as a mask, and the impurity region is formed in a self-aligning manner. At this point, the island-like semiconductor layer that forms the N channel TFT is covered by a photoresist mask 116. The impurity region 117 is then formed by ion doping using diborane ($B_2H_6$). The boron (B) concentration of this region is set to between $3\times10^{20}$ atoms/cm$^3$ and $3\times10^{21}$ atoms/cm$^3$. The concentration of the impurity element for imparting p-type conductivity contained in an impurity region 134 formed here is referred to as ($p^+$) throughout this specification.

Figure 5D:
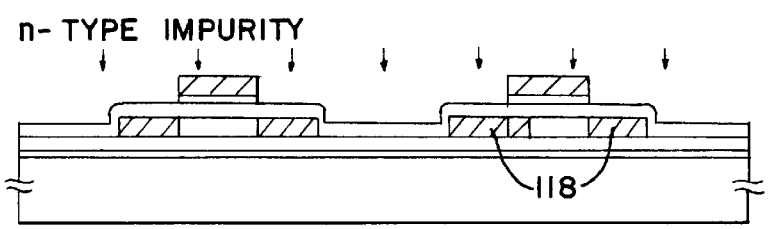

<$n^+$ Doping Process: FIG. 5D>

Next, formation of an impurity region 118 which forms a source region or a drain region of the N channel TFT is performed. Ion doping using phosphine ($PH_3$) is performed here, and the phosphorus (P) concentration in this region is set to between $1\times10^{20}$ atoms/cm$^3$ and $1\times10^{21}$ atoms/cm$^3$. The concentration of the impurity element for imparting n-type conductivity contained in the impurity region 118 formed here is referred to as ($n^+$). Phosphorus (P) is simultaneously doped into the impurity region 117. However, compared with the concentration of boron (B) already doped in the previous step, the concentration of phosphorus (P) doped into the impurity region 117 is about ½ to ⅓ of that of boron, and therefore the p-type conductivity is ensured and no influence is imparted to the TFT characteristics.

Figure 5E:
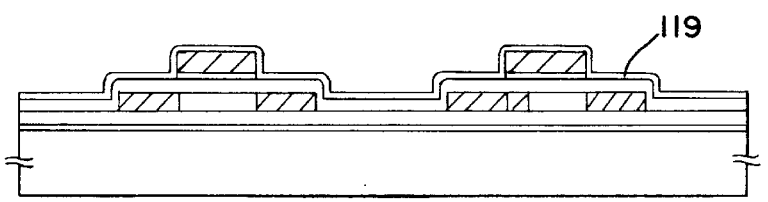

<Formation of the Protection Insulating Layer, Performing the Activation Process and the Hydrogenation Process: FIG. 5E>

Thereafter, a process of activating the impurity elements which impart n-type or p-type conductivity doped at their respective concentrations is performed by thermal annealing. The furnace annealing method may be used in this process. In addition, laser annealing or rapid thermal annealing (RTA) can also be used to perform the activation process. The annealing process is performed under a nitrogen atmosphere which has an oxygen concentration of 1 ppm or less, preferably 0.1 ppm or less at a temperature of between 400° C. and 700° C., typically between 500° C. and 600° C. Heat treatment is performed for 4 hours at 500° C. in Embodiment Mode 1. Further, prior to the annealing process, it is appropriate to form a protection insulating layer 119 from a silicon oxynitride film or a silicon oxide film to a thickness of between 50 nm to 200 nm. The silicon oxynitride film may also be formed under any of the conditions shown in Table 1. However, the film may also be formed under other conditions in which $SiH_4$ is set to 27 sccm, $N_2O$ to 900 sccm, the reaction pressure to 160 Pa, the substrate temperature to 325° C., and the electric discharge power density to 0.1 W/cm$^2$.

After the activation process, additional heat treatment is performed under an atmosphere containing 3% to 100% of hydrogen for 1 to 12 hours at a temperature of between 300° C. and 450° C. to thereby hydrogenate the island-like semiconductor savers. This process is for terminating dangling bonds in the semiconductor layers by thermally excited hydrogen. Plasma hydrogenation (using hydrogen excited by a plasma) may be performed as another means of hydrogenation.

Figure 5F:
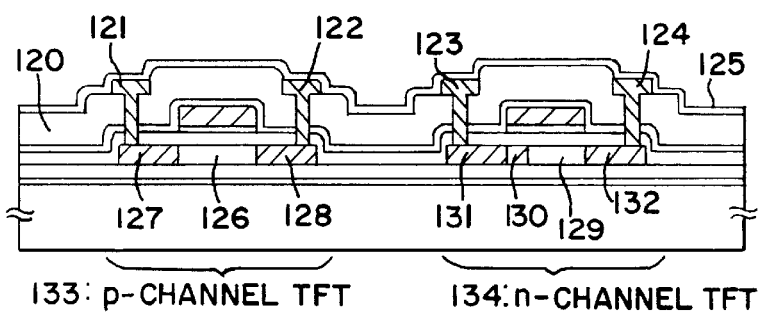

<Formation of the Interlayer Insulating Layer, the Source Wiring, and the Drain Wiring, and Formation of the Passivation Film: FIG. 5F>

Upon completion of the activation and the hydrogenation processes, a silicon oxynitride film or a silicon oxide film is laminated on the protection insulating layer to thereby form an interlayer insulating layer 120. Similar to the protective insulating layer 119, the silicon oxynitride film is formed to a thickness of between 500 nm and 1500 nm (preferably between 600 nm and 800 nm) by introducing $SiH_4$ at 27 sccm and $N_2O$ at 900 sccm, setting the reaction pressure to 160 Pa, the substrate temperature to 325° C., and the electric discharge power density to 0.15 W/cm$^2$.

Contact holes are then formed in the interlayer insulating layer 120 and the protective insulating layer 119 to reach the source region or the drain region of the TFT, thereby forming source wirings 121 and 124, and drain wirings 122 and 123. Although not shown in the figures, in Embodiment Mode 1, these electrodes are lamination films having a four layer structure that is composed of a 60 nm titanium (Ti) film, a 40 nm titanium nitride (TiN) film, a 300 nm aluminum (Al) film containing silicon (Si), and a 100 nm titanium (Ti) film formed in succession by sputtering.

Next, a silicon nitride film or a silicon oxynitride film is formed to a thickness of between 50 nm and 500 nm (typically between 100 nm and 350 nm) as a passivation film 125. In addition, if the hydrogenation process is performed in this state, then a desirable result of improving the TFT characteristics can be obtained. For example, it is appropriate to perform heat treatment under an atmosphere containing 3% to 100% of hydrogen for 1 to 12 hours at a temperature of between 300° C. and 450° C., or the same effects can be obtained by employing the plasma hydrogenation method.

An N channel TFT 134 and a P channel TFT 133 are thus completed on the substrate 101. The p channel TFT 133 has a channel forming region 126, a source region 127, and a drain region 128 in the island-like semiconductor layer 104. The N channel TFT 134 has a channel forming region 129, an LDD region 130 overlapping the gate electrode 115 (this type of LDD region is hereinafter referred to as an Lov region), a source region 132, and a drain region 131 in the island-like semiconductor layer 105. The length of the Lov region in the channel length direction is set between 0.5 µm and 3.0 µm (preferably between 1.0 µm and 1.5 µm) with respect to a channel length of 3 µm to 8 µm. Single gate structures are taken for the respective TFTs in FIGS. 5A to 5F, but double gate structures may also be used, and multi-gate structures in which a plurality of gate electrodes are formed may also be used without causing any problem.

Figure 1:
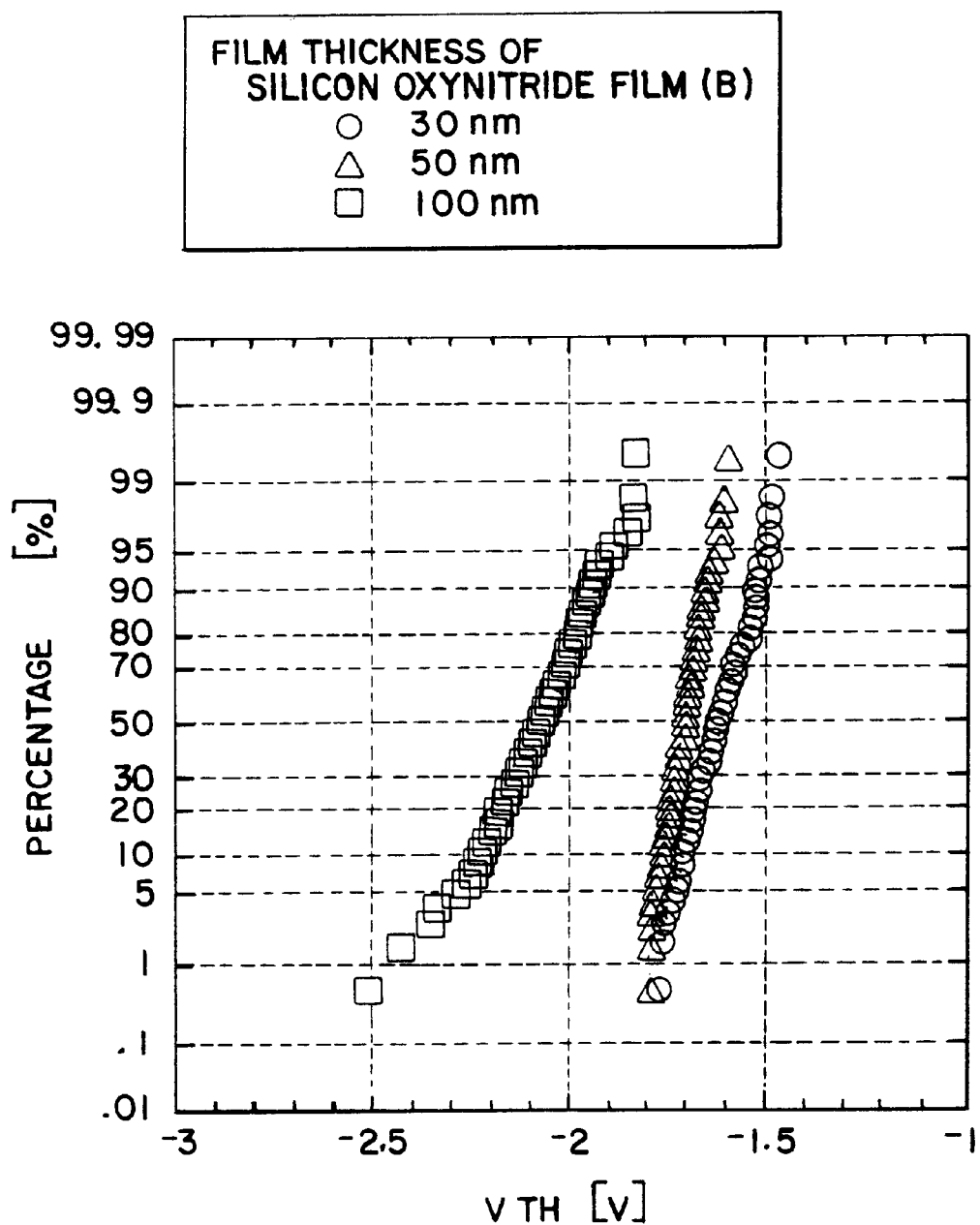
FIG. 1 is a diagram showing fluctuations of Vth of a P channel TFT when the film thickness of a silicon oxynitride film (B) is changed.
Figure 2:
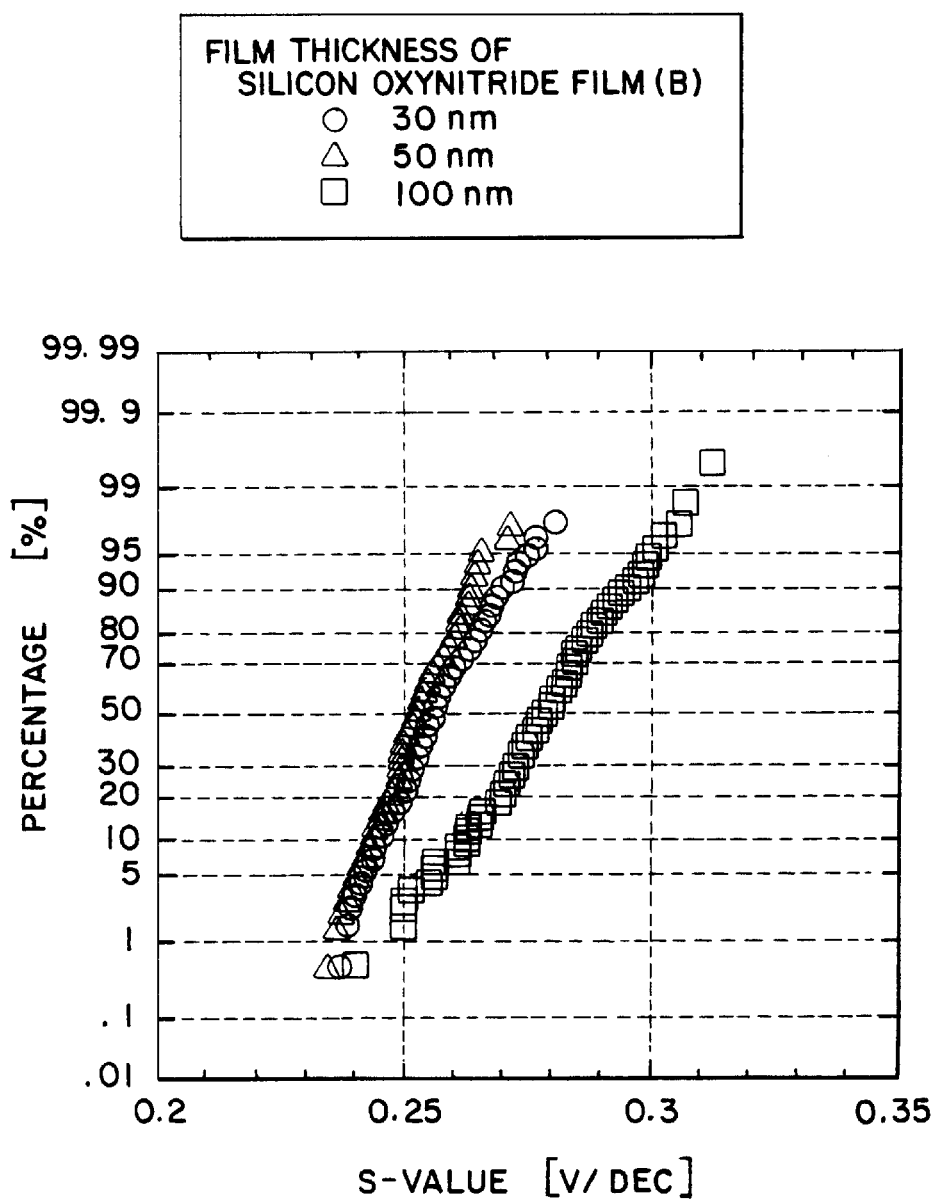
FIG. 2 is a diagram showing fluctuations of an S-value of the P channel TFT when the film thickness of the silicon oxynitride film (B) is changed.
Figure 3:
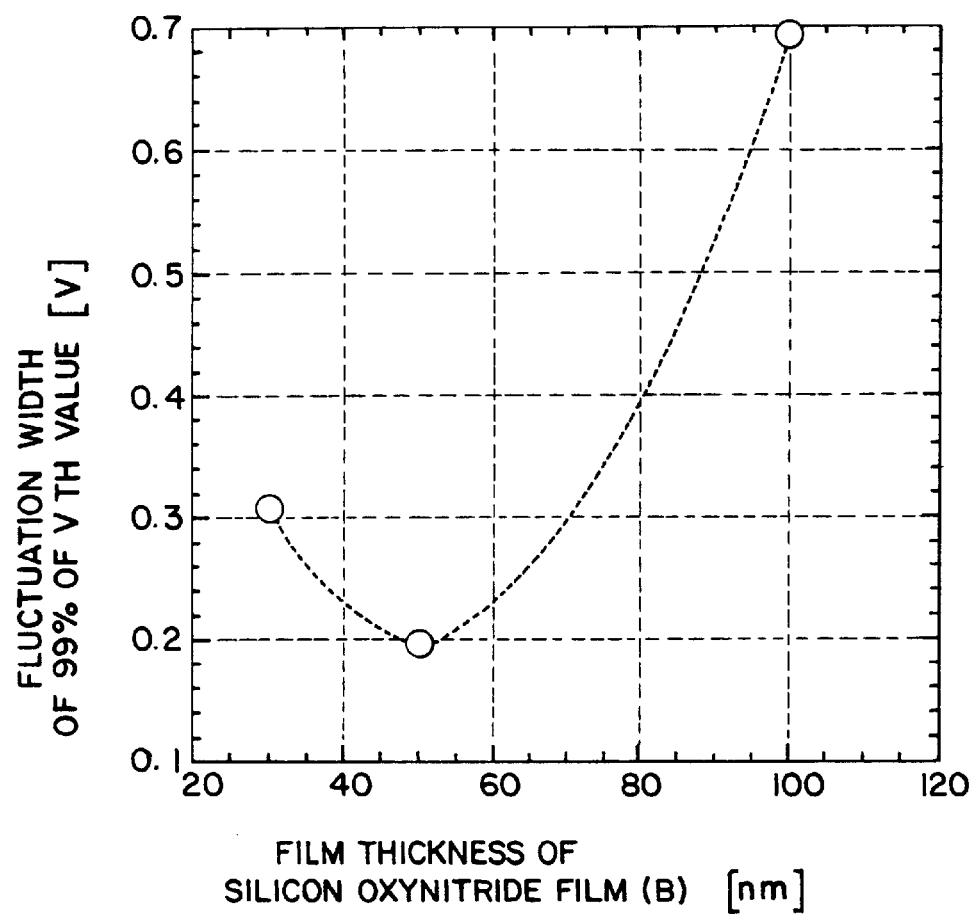
FIG. 3 is a diagram showing a relationship between a width of a 99% fluctuation of the Vth and the film thickness of the silicon oxynitride film (B)

The results in evaluating the fluctuations of the characteristics of the TFT in the substrate thus manufactured are shown in the above-mentioned FIGS. 1 and 2. As shown in the figures, when the film thickness of the silicon oxynitride film (B) serving as the second layer (upper layer) of the two-layered blocking film, which is provided on the side of the back channel, is 50 nm, the fluctuations in the characteristics of the TFT can be made smaller. Therefore, there is an optimal range for the film thickness and film quality of the two-layered blocking film, and by making an appropriate combination thereof, not only the characteristic of the TFT can be stabilized but the fluctuations in the Vth and the S-value can be reduced.

[Embodiment 1]

Embodiment 1 of the present invention is explained with reference to FIGS. 6A to 10. Here, a detailed explanation is made on a method of manufacturing on the same substrate a pixel TFT of a pixel portion and a TFT of a driver circuit that is provided in the periphery of the pixel portion in accordance with the processes. However, in order to simplify the explanation, a CMOS circuit, which is the basic circuit for control circuits such as a shift register circuit and a buffer circuit, and an N channel TFT that forms a sampling circuit are shown in the figures.

A barium borosilicate glass substrate or an alumino borosilicate glass substrate is used as a substrate 201 in FIG. 6A. The alumino borosilicate glass substrate is used in Embodiment 1. At this point, heat treatment may be performed in advance at a temperature lower than the distortion point of the glass by about 10° C. to 20° C. On a surface of the substrate 201 on which TFTs will be formed, a silicon oxynitride film (A) 202a is formed to a thickness of 50 nm to 100 nm and a silicon oxynitride film (B) 202b is formed to a thickness of 30 nm to 70 nm to laminate thereon, thereby forming a blocking layer 202. In Embodiment 1, the silicon oxynitride film (A) 202a is formed to a thickness of 50 nm and the silicon oxynitride film (B) 202b is formed to a thickness of 50 nm laminating thereon to thereby form the blocking layer 202. By forming the blocking layer with such a structure, not only is the diffusion of impurity elements such as alkali metallic elements from the substrate 201 prevented, but the fluctuations of the electrical characteristics of the TFT can be reduced.

Next, a semiconductor layer 203a having an amorphous structure is formed to a thickness of between 25 nm and 80 nm (preferably between 30 nm and 60 nm) by a known method such as plasma CVD or sputtering. In Embodiment 1, an amorphous silicon film is formed to a thickness of 54 nm by plasma CVD. An amorphous semiconductor film and a microcrystalline semiconductor film exist as the semiconductor film having an amorphous structure, and a compound semiconductor film having an amorphous structure, such as an amorphous silicon germanium film, may also be applied. Furthermore, both the blocking layer 202 and the amorphous silicon layer 203a may be formed using the same film deposition method, and hence both the layers may be formed in succession. By not exposing the surface to the atmosphere even once after forming the base film, it becomes possible to prevent contamination of the surface, whereby changes in the threshold voltage can be reduced. (See FIG. 6A).

Then a crystalline silicon layer 203b is formed of the amorphous silicon layer 203a by using a known crystallization technique. For example, laser annealing and thermal annealing (solid phase growth methods) are applicable. In Embodiment 1, the crystalline silicon layer 203b is formed by a crystallization method using a catalytic element in accordance with the technique disclosed in Japanese Patent Application Laid-open No. Hei 7-130652. First, an aqueous solution containing 10 ppm by weight of a catalytic element is applied by spin coating, thereby forming a layer containing the catalytic element (not shown in the figure). Elements such as iron (Fe), cobalt (Co), nickel (Ni), ruthenium (Ru), rhodium (Rh), palladium (Pd), osmium (Os), iridium (Ir), platinum (Pt), copper (Cu), and gold (Au) may be used as the catalytic element. In the crystallization process, heat treatment is first performed for approximately 1 hour at a temperature between 400° C. and 500° C. to thereby set the amount of hydrogen contained in the amorphous silicon film to 5 atomic % or less. Thermal annealing is then performed under a nitrogen atmosphere at a temperature between 550° C. to 600° C. for 1 to 8 hours using the furnace annealing method. A crystalline silicon film can thus be obtained through the above steps. Under this state, the concentration of the catalytic element remaining in the surface of the crystalline silicon film is between $3 \times 10^{10}$ atoms/cm$^3$ and $2 \times 10^{11}$ atoms/cm$^3$. Thereafter, laser annealing may also be performed in conjunction with thermal annealing in order to improve the crystallization ratio. For example, an XeCl excimer laser (wavelength is 308 nm) is used to form a linear shape beam by an optical system, the oscillation frequency is set between 5 Hz and 50 Hz, the energy density is set between 100 mJ/cm$^2$ and 500 mJ/cm$^2$, and the beam is irradiated with an overlap ratio of the linear beam of between 80% and 98%. The crystalline silicon layer 203b is thus obtained. (See FIG. 6B).

The crystalline silicon layer 203b is then etched and divided into island-shapes to thereby form island-like semiconductor layers 204 to 207 as active layers. A mask layer 208 is then formed from a silicon oxide film to a thickness of between 50 nm and 100 nm by plasma CVD, decompression CVD, or sputtering. For example, the silicon oxide film is formed by decompression CVD using a mixed gas of SiH$_4$ and O$_2$ and then heating it at 400° C. at a pressure of 266 Pa. (See FIG. 6C).

Channel doping is then performed. First, a photoresist mask 209 is formed and then boron (B) is doped, at a concentration of about $1 \times 10^{16}$ atoms/cm$^3$ to $5 \times 10^{17}$ atoms/cm$^3$, as an impurity element that imparts p-type conductivity to the entire surface of the island-like semiconductor layers 205 to 207 that form the N channel TFT with the aim of controlling the threshold voltage. Ion doping may be used for the doping of boron (B), and boron (B) can be doped at the same time as the amorphous silicon film is formed. It is not always necessary to dope boron (B) here, but it is preferable to form semiconductor layers 210 to 212 with boron doped therein in order to place the threshold voltage of the N channel TFT within a predetermined range. (See FIG. 6D).

In order to form an LDD region of the N channel TFT of the driver circuit, an impurity element that imparts n-type conductivity is selectively doped into the island-like semiconductor layers 210 and 211. Photoresist masks 213 to 216 are formed in advance for this purpose. To dope phosphorus (P), ion doping using phosphine (PH$_3$) is applied here. The phosphorus (P) concentration of impurity regions (n$^-$) 217 and 218 that are formed is set to between $2 \times 10^{16}$ atoms/cm$^3$ and $5 \times 10^{19}$ atoms/cm$^3$. Further, an impurity region 219 is a semiconductor layer for forming a storage capacitor in the pixel portion, and phosphorus (P) is doped into this region at the same concentration. (See FIG. 7A).

Figure 7A:
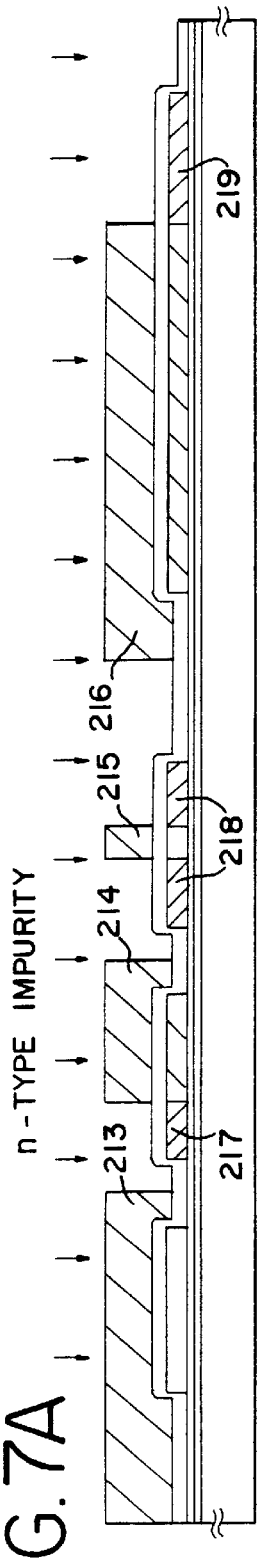
FIGS. 7A to 7D are cross-sectional views showing a process of manufacturing a TFT in accordance with Embodiment 1 of the present invention.
Figure 7B:
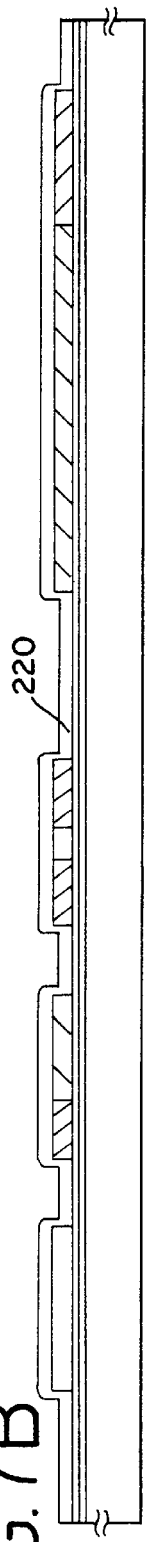
Figure 7C:
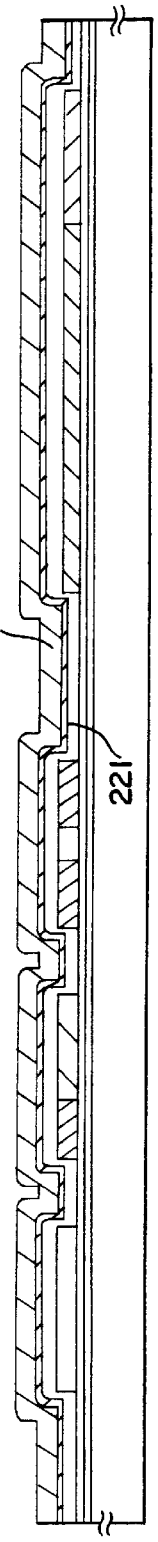
Figure 7D:
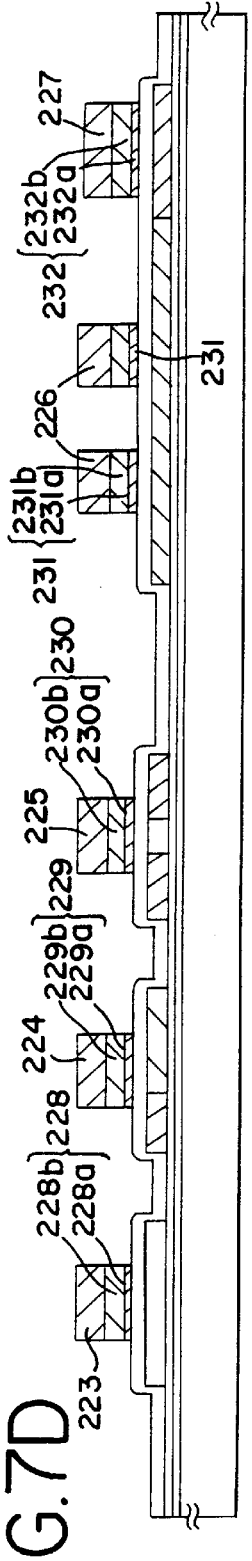

The mask layer 208 is removed next by a substance such as hydrofluoric acid, and a step of activating the impurity elements doped in the steps illustrated in FIG. 6D and FIG. 7A is performed. The activation can be performed by thermal annealing for 1 to 4 hours at a temperature between 500° C. and 600° C. under a nitrogen atmosphere, or by laser annealing. Further, both methods may be performed together. Note that there are no specific limitation placed on the laser light irradiation conditions, and that the operator may set them suitably.

A gate insulating film 220 is then-formed of an insulating film containing silicon to a thickness of between 40 nm and 150 nm by using plasma CVD or sputtering. For example, the gate insulating film 220 may be formed of the silicon oxynitride film (B). Other insulating films containing silicon formed into a single layer or a lamination structure may also be used as the gate insulating film 220. (See FIG. 7B).

Next, a first conductive layer is formed in order to form a gate electrode. A conductive layer (A) 221 made of a metallic nitride film having conductivity, and a conductive layer (B) 222 made of a metallic film are laminated in Embodiment 1. Here, the conductive layer (A) 221 is formed from tantalum nitride (TaN) to a thickness of 50 nm and the conductive layer (B) 222 is formed from tantalum (Ta) to a thickness of 350 nm. Both the layers are formed by sputtering. (See FIG. 7C).

Photoresist masks 223 to 227 are formed next, and the conductive layer (A) 221 and the conductive layer (B) 222 are etched together to thereby form gate electrodes 228 to 231 and a capacitor wiring 232. The gate electrodes 228 to 231 and the capacitor wiring 232 are formed integrally from conductive layers (A) 228a to 232a and conductive layers (B) 228b to 232b, respectively. At this point, the gate electrodes 229 and 230 formed in the driver circuit are formed so as to overlap a portion of the impurity regions 217 and 218 through-the gate insulating film 220. (See FIG. 7D).

Next, in order to form a source region and a drain region of the P channel TFT of the driver circuit, the process of doping an impurity element that imparts p-type conductivity is performed. Impurity regions are formed in a self-aligning manner here with the gate electrode 228 as a mask. The region in which the N channel TFT is formed is covered with a photoresist mask 233. An impurity region (p$^+$) 234 is then formed by ion doping using diborane (B$_2$H$_6$) at a concentration of $1\times10^{21}$ atoms/cm$^3$. (See FIG. 8A).

In the N channel TFT, formation of impurity regions functioning as a source region or a drain region thereof is performed next. Resist masks 235 to 237 are formed, and an impurity element that imparts n-type conductivity is doped to thereby form impurity regions 238 to 242. This is performed by ion doping using phosphine (PH$_3$), and the phosphorus (P) concentration of the impurity regions (n$^+$) 238 to 242 is set to $5\times10^{20}$ atoms/cm$^3$. The impurity region 238 contains boron (B) in advance, which was doped in a previous step. In comparison, phosphorus (P) is doped at a concentration of ½ to ⅓ that of boron (B), and therefore the influence of phosphorus (P) need not be considered, and there is no influence imparted to the characteristics of the TFT. (See FIG. 8B).

A step of doping an impurity element that imparts n-type conductivity is then performed in order to form an LDD region of the N channel TFT of the pixel portion. The impurity element that imparts n-type conductivity is doped by ion doping in a self-aligning manner using the gate electrode 231 as a mask. The concentration of phosphorus (P) to be doped is set to $5\times10^{16}$ atoms/cm$^3$. By doping phosphorus (P) at a concentration that is lower than that of the impurity elements doped at the steps illustrated in FIG. 7A, FIG. 8A, and FIG. 8B, substantially only impurity regions (n$^-$) 243 and 244 are formed. (See FIG. 8C).

Thereafter, heat treatment process is performed in order to activate the impurity elements which impart n-type or p-type conductivity and which have been doped at the respective concentrations. Thermal annealing using furnace annealing, laser annealing, or rapid thermal annealing (RTA) can be employed for this heat treatment process. The activation process is performed here using furnace annealing. Heat treatment is performed under a nitrogen atmosphere in which the oxygen concentration is 1 ppm or less, preferably 0.1 ppm or less, at a temperature between 400° C. and 700° C., typically between 500° C. and 600° C.

Through this thermal annealing, conductive layers (C) 228c to 232c, made from tantalum nitride (TaN), are formed to a thickness of 5 nm to 80 nm from the surfaces of the tantalum (Ta) films 228b to 232b that form the gate electrodes 228 to 231 and the capacitor wiring 232, respectively. In addition, when the conductive layers (B) 228b to 232b are made from tungsten (W), tungsten nitride (WN) is formed, and titanium nitride (TiN) can be formed when the conductive layers are made of titanium (Ti). Further, these layers can be formed similarly by exposing the gate electrodes 228 to 231 to a plasma atmosphere containing nitrogen using a substance such as nitrogen or ammonia. In addition, a process of hydrogenating the island-like semiconductor layers is performed by thermal annealing at a temperature of between 300° C. and 400° C. for 1 to 12 hours under an atmosphere containing 3% to 100% of hydrogen. This process is one for terminating the dangling bonds in the semiconductor layers by thermally excited hydrogen. Plasma hydrogenation (using hydrogen excited by a plasma) may be performed as another means of hydrogenation.

In the case of manufacturing the island-like semiconductor layers from an amorphous silicon film by a crystallization method using a catalytic element as in Embodiment 1, small traces (about $1\times10^{17}$ atoms/cm$^3$ to $1\times10^{19}$ atoms/cm$^3$) of the catalytic element remain within the island-like semiconductor layers. It is, of course, possible to complete the TFT in such a state, but it is preferable to remove the remaining catalytic element from at least the channel forming region. As one of the means of removing the catalytic element, there is a means of using the gettering action of phosphorus (P). The concentration of phosphorus (P) necessary for gettering may be on a similar order as that of the impurity regions (n$^+$) formed at the step illustrated in FIG. 8B. The catalytic element can be segregated from the channel forming regions of the N channel TFT and the P channel TFT into the impurity regions 238 to 242 to thereby be gettered by the thermal annealing of the activation step implemented here. As a result, the catalytic element is segregated into the impurity regions 238 to 242 at a concentration of about $1\times10^{17}$ atoms/cm$^3$ to $1\times10^{19}$ atoms/cm$^3$. (See FIG. 8D).

Figure 8A:
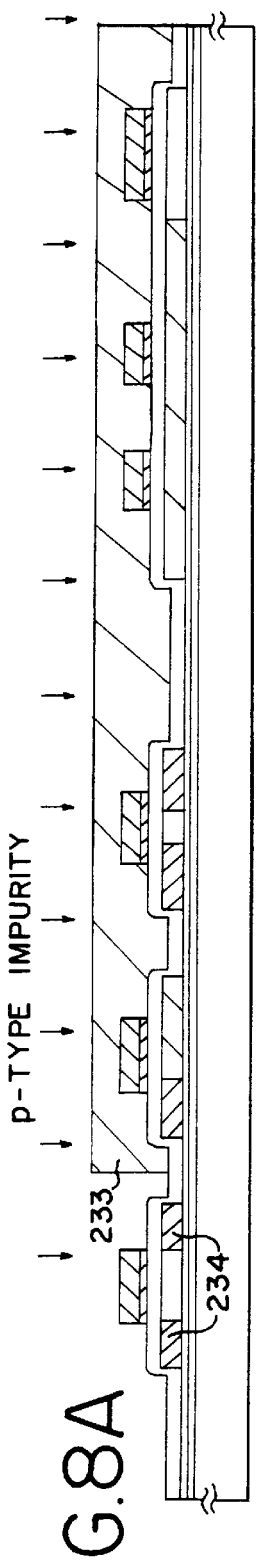
FIGS. 8A to 8D are cross-sectional views showing a process of manufacturing a TFT in accordance with Embodiment 1 of the present invention.
Figure 8B:
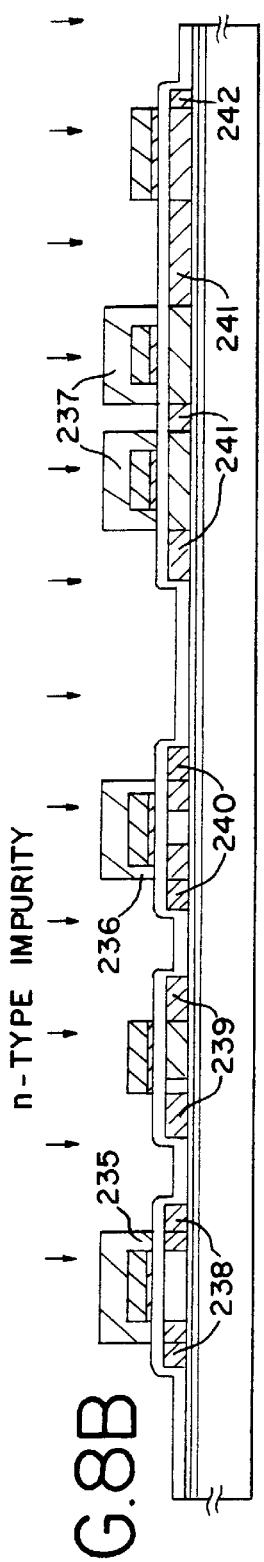
Figure 8C:
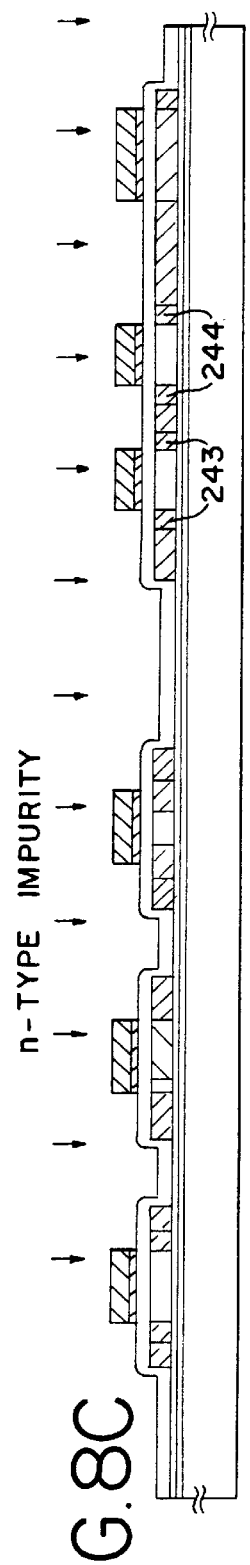
Figure 8D:
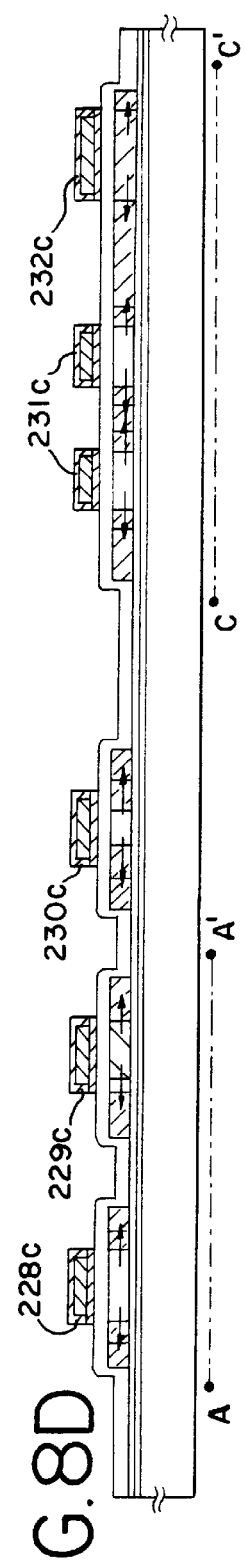
Figure 11A:
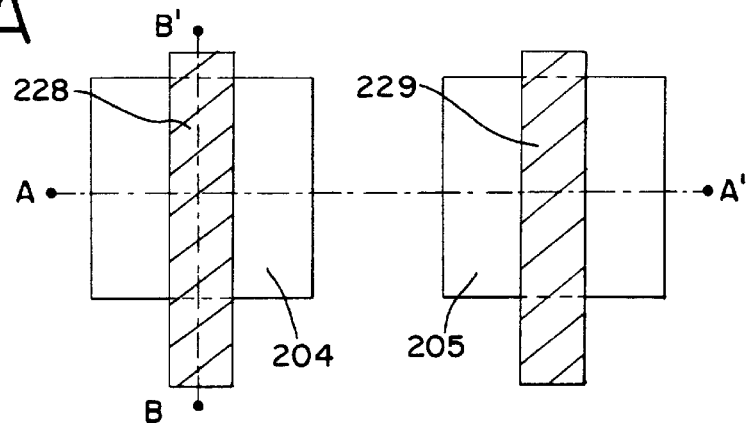
FIGS. 11A to 11C are top views showing a process of manufacturing a driver circuit TFT in accordance with Embodiment 1 of the present invention.
Figure 11B:
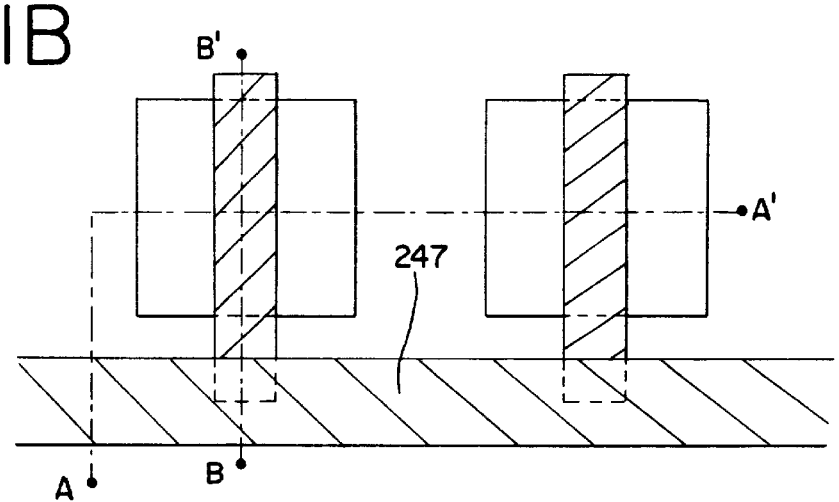
Figure 11C:
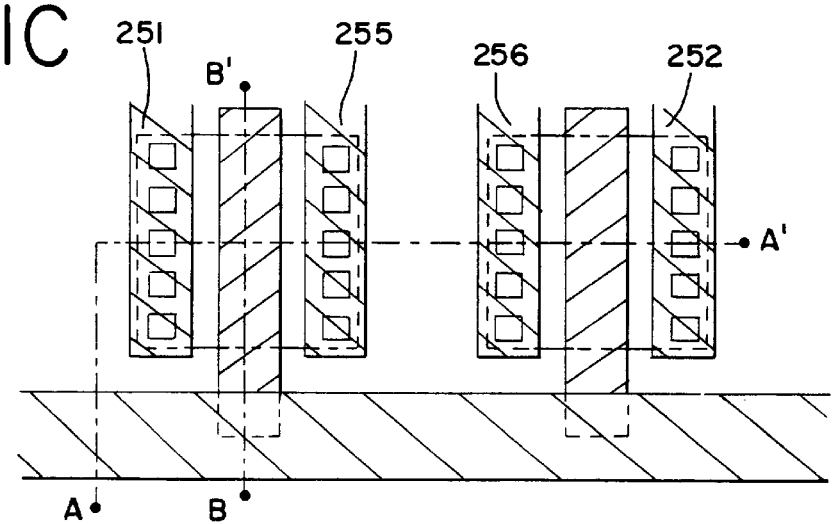
Figure 12A:
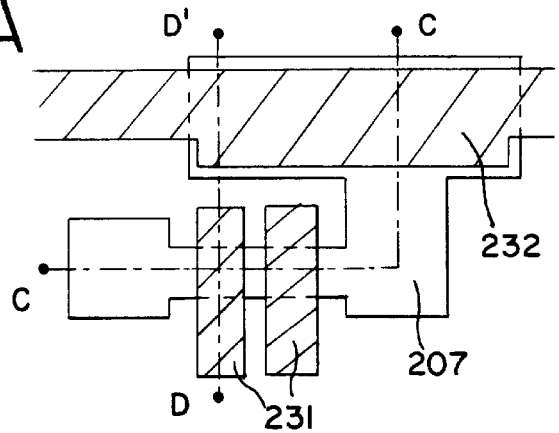
FIGS. 12A to 12C are top views showing a process of manufacturing a pixel TFT and a TFT of a storage capacitor in accordance with Embodiment 1 of the present invention.
Figure 13A:
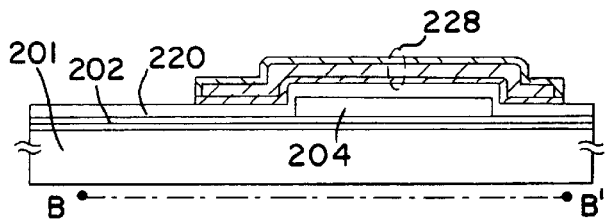
FIGS. 13A to 13C are top views showing a process of manufacturing a driver circuit TFT in accordance with Embodiment 1 of the present invention.
Figure 14A:
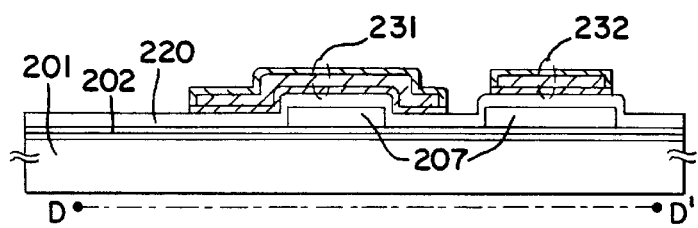
FIGS. 14A to 14C are top views showing a process of manufacturing a pixel TFT and a TFT of a storage capacitor in accordance with Embodiment 1 of the present invention.

FIGS. 11A and 12A are top views of the TFTs formed up through the present process, and the cross sections taken along the line A-A' and the line C-C' correspond to the line A-A' and the line C-C', respectively, of FIG. 8D. Further, the cross sections taken along the line B-B' and the line D-D' correspond to the cross-sectional views of FIG. 13A and FIG. 14A. The gate insulating film is omitted from the top views of FIGS. 11A to 11C and FIGS. 12A to 12C. However, up to the present process, at least the gate electrodes 228 to 231 and the capacitor wiring 232 are formed on the island-like semiconductor layers 204 to 207, as shown in the figures.

Upon completion of the activation and hydrogenation processes, a second conductive layer is formed as a gate wiring. The second conductive layer is formed of a conductive layer (D) that is made from a low resistance material which has aluminum (Al) or copper (Cu) as its principal constituent. Whichever is used, the resistivity of the second conductive layer is set to between 0.1 $\mu\Omega$cm and 10 $\mu\Omega$cm. It is appropriate that a conductive layer (E) made from titanium (Ti), tantalum (Ta), tungsten (W), or molybdenum (Mo) is laminated on the conductive layer (D). In Embodiment 1, an aluminum (Al) film containing 0.1% to 2% by weight of titanium (Ti) is formed as the conductive layer (D) 245, and a titanium (Ti) film is formed as the conductive layer (E) 246. The conductive layer (D) 245 may be formed to a thickness of between 200 nm and 400 nm (preferably between 250 nm and 350 nm), and the conductive layer (E) 246 may be formed to a thickness of between 50 nm and 200 nm (preferably between 100 nm and 150 nm). (See FIG. 9A).

The conductive layer (E) 246 and the conductive layer (D) 245 are then etched to form a gate wiring to be connected to the gate electrode, thereby forming gate wirings 247 and 248, and a capacitor wiring 249. In the etching process, dry etching using a mixed gas of $SiCl_4$, $Cl_2$ and $BCl_3$ is performed first to remove the conductive layer (D) until the middle thereof from the surface of the conductive layer (E). Thereafter, by removing the conductive layer (D) by wet etching using a phosphoric acid-based etching solution, the gate wiring can be formed while maintaining the selective processibility with the base film.

Figure 9A:
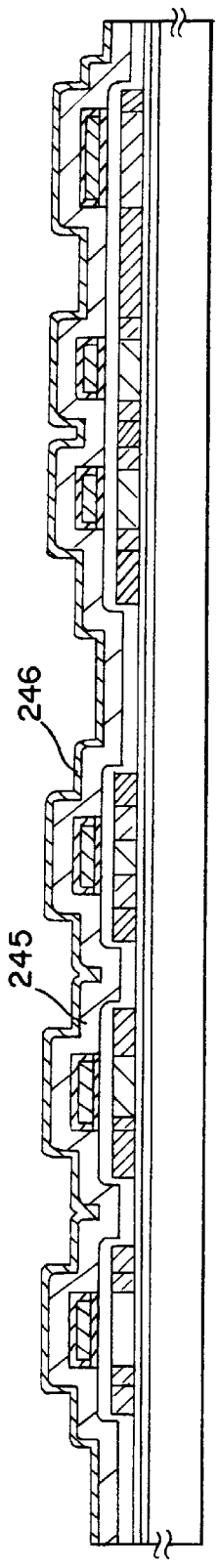
FIGS. 9A to 9C are cross-sectional views showing a process of manufacturing a TFT in accordance with Embodiment 1 of the present invention.
Figure 9B:
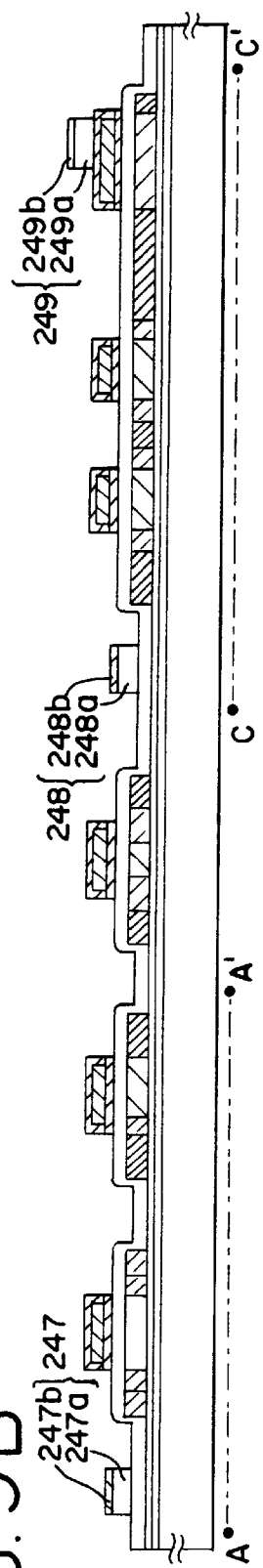
Figure 12B:
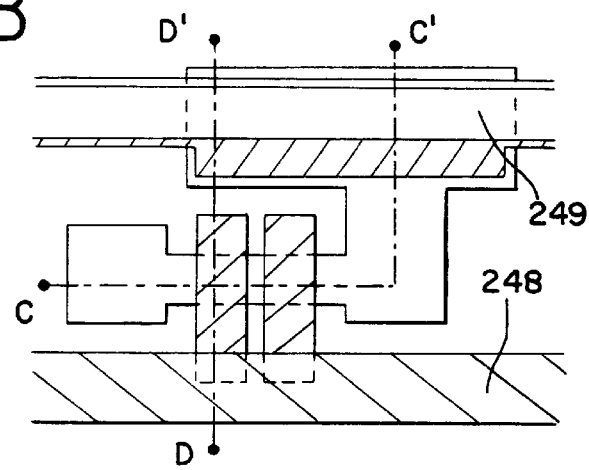
Figure 13B:
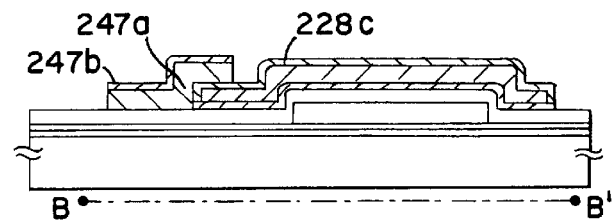
Figure 14B:
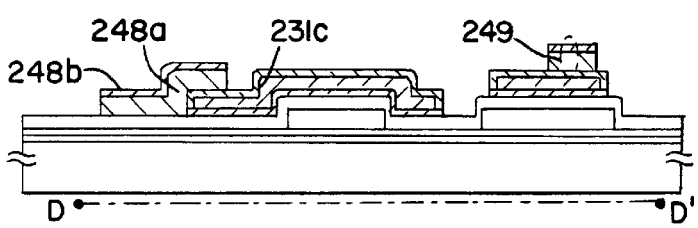

FIGS. 11B and 12B show top views of this state, and the cross sections taken along the line A-A' and the line C-C' correspond to the cross sections taken along the line A-A' and the line C-C', respectively, of FIG. 9B. Further, the cross sections taken along the line B-B' and the line D-D' correspond to the line B-B' and D-D' of FIG. 13B and FIG. 14B, respectively. In FIGS. 11B and 12B, a portion of the gate wirings 247 and 248 overlaps a portion of the gate electrodes 228, 229, and 231 and is in electrical contact. This state is also made clear from the cross-sectional structure views of FIG. 13B and FIG. 14B corresponding to the cross sections taken along the lines B-B' and D-D'. The conductive layer (C) forming the first conductive layer is electrically contacted with the conductive layer (D) forming the second conductive layer.

A first interlayer insulating film 250 is formed from a silicon oxide film or a silicon oxynitride film to a thickness of 500 nm to 1500 nm. Next, contact holes are formed to reach the source regions or the drain regions that are formed in the respective island-like semiconductor layers to thereby form source wirings 251 to 254, and drain wirings 255 to 258.

Next, a silicon nitride film, a silicon oxide film, or a silicon oxynitride film is formed to a thickness of between 50 nm and 500 nm (typically between 100 nm and 300 nm) as a passivation film 259. If the hydrogenation process is performed in this state, then a desirable result can be obtained with respect to improving the TFT characteristics. For example, heat treatment may be performed under an atmosphere containing 3% to 100% of hydrogen at a temperature of between 300° C. to 450° C. for 1 to 12 hours, or a similar result can also be obtained by performing the hydrogenation process using plasma hydrogenation. Note that openings may be formed in the passivation film 259 at locations where the contact holes for connecting a pixel electrode and a drain wiring will later be formed. (See FIG. 9C).

Figure 9C:
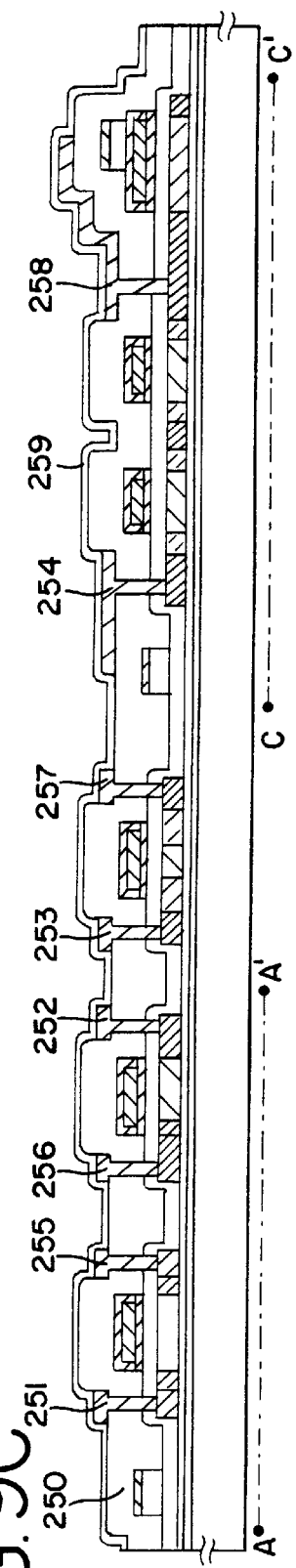
Figure 12C:
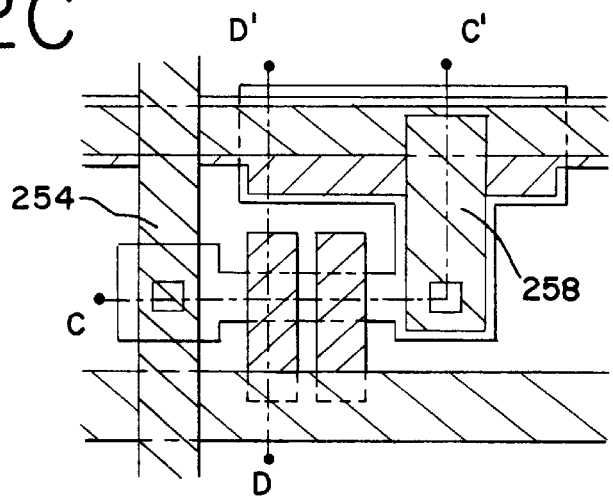
Figure 13C:
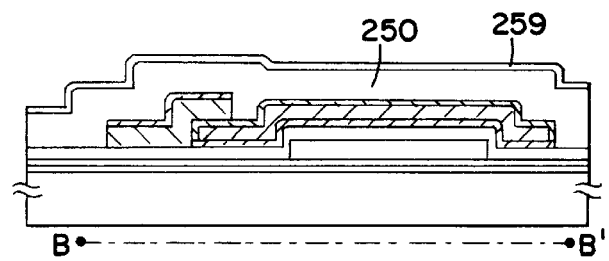
Figure 14C:
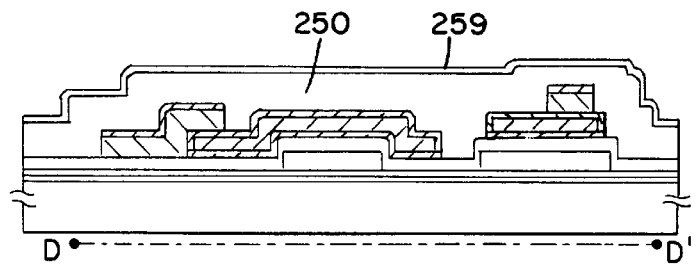

FIGS. 11C and 12C show top views of this state, and the cross sections taken along the line A-A' and the line C-C' correspond to the cross sections taken along the line A-A' and line C-C', respectively, of FIG. 9C. Further, the cross sections taken along the line B-B' and the line D-D' correspond to the cross sections taken along the line B-B' and the line D-D' of FIG. 13C and FIG. 14C, respectively. In FIGS. 11C and 12C, the first interlayer insulating film is omitted, and the source wirings 251, 252, and 254, and the drain wirings 255, 256, and 258 are connected to the respective source and drain regions of the island-like semiconductor layers 204, 205, and 207, which are not shown in the figures, through contact holes formed in the first interlayer insulating film.

A second interlayer insulating film 260 is formed next from an organic resin to a thickness of between 1.0 $\mu$m and 2.5 $\mu$m. Materials such as polyimide, acrylic, polyamide, polyimide amide, and BCB (benzocyclobutene) can be used as the organic resin. A thermal polymerization type polyimide is used here, and this is burnt at 300° C. after application to the substrate. A contact hole is then formed in the second interlayer insulating film 260 to reach the drain wiring 258, thereby forming pixel electrodes 261 and 262. A transparent conductive film is used for the pixel electrodes in a transmission type liquid crystal display device, and a metallic film is used in a reflection type liquid crystal display device. For the purpose of manufacturing a transmission type liquid crystal display device in Embodiment 1, a 100 nm thick indium tin oxide (ITO) film is formed by sputtering. (See FIG. 10).

The substrate having the TFTs of the driver circuit and the pixel TFT of the pixel portion formed on the same substrate is thus completed. A P channel TFT 301, a first N channel TFT 302, and a second N channel TFT 303 are formed in the driver circuit, and a pixel TFT 304 and a storage capacitor 305 are formed in the pixel portion. For the sake of convenience, this type of substrate is referred to as an active matrix substrate throughout this specification.

Figure 10:
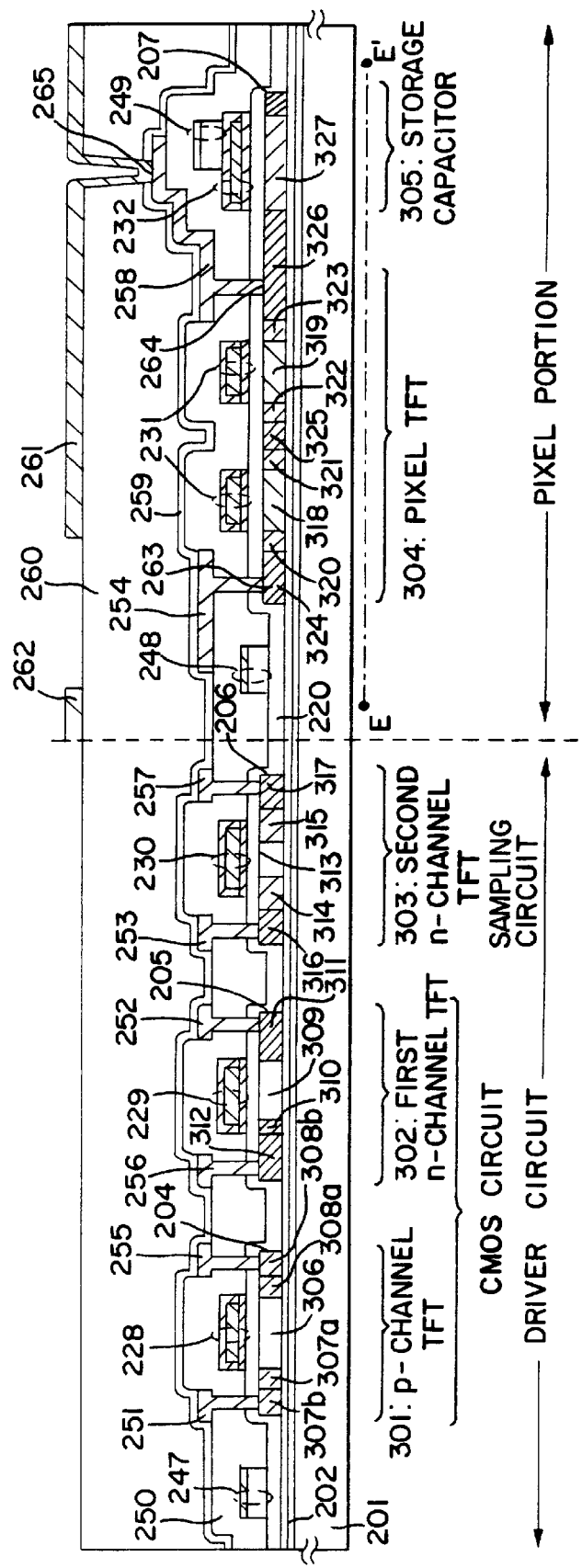
FIG. 10 is a cross-sectional view showing a process of manufacturing a TFT in accordance with Embodiment 1 of the present invention.

The p channel TFT 301 of the driver circuit has a channel forming region 306, source regions 307a and 307b, and drain regions 308a and 308b in the island-like semiconductor layer 204. The first N channel TFT 302 has a channel forming region 309, an LDD region (Lov) 310 overlapping the gate electrode 229, a source region 311, and a drain region 312 in the island-like semiconductor layer 205. The length of the Lov region in the channel length direction is set between 0.5 $\mu$m and 3.0 $\mu$m, preferably between 1.0 $\mu$m and 1.5 $\mu$m. A channel forming region 313, regions which contains an Lov region, and an Loff region (an LDD region which does not overlap the gate electrode, hereinafter referred to as an Loff region) 314 and 315, a source region 316, and a drain region 317 are formed in the island-like semiconductor layer 206 of the second N channel TFT 303, and the length of the Loff region in the channel length direction is set between 0.3 $\mu$m and 2.0 $\mu$m, preferably between 0.5 $\mu$m and 1.5 $\mu$m. The island-like semiconductor layer 207 of the pixel TFT 304 has channel forming regions 318 and 319, Loff regions 320 to 323, and source or drain regions 324 to 326. The length of the Loff region in the channel length direction is between 0.5 $\mu$m and 3.0 $\mu$m, preferably between 1.5 $\mu$m and 2.5 $\mu$m. In addition, the storage capacitor 305 is formed from the capacitor wirings 232 and 249, an insulating film made from the same material as the gate insulating film, and a semiconductor layer 327 connected to the drain region 326 of the pixel TFT 304 and doped therein with an impurity element that imparts n-type conductivity. In FIG. 10, the pixel TFT 304 is formed having a double gate structure, but a single gate structure may be formed, and a multi-gate structure in which a plurality of gate electrodes are formed may also be formed without causing any problem.

Thus, by forming the blocking layer 202 from the silicon oxynitride film (A) and the silicon oxynitride film (B) as shown in Embodiment Mode 1, in the present invention, not only can be the electrical characteristic of the TFT that was completed stabilized but the fluctuations in the Vth and the S-value can also be reduced. As a result, the reproductivity of the gradation display of the liquid crystal display device, particularly the reproductivity of an intermediate color can be improved and the driving voltage thereof can be further reduced, whereby the consumption power can be reduced.

[Embodiment 2]

In Embodiment 2, a process of manufacturing an active matrix type liquid crystal display device from the active matrix substrate manufactured in Embodiment 1 will be explained. As shown in FIG. 15, an alignment film 601 is formed on the active matrix substrate that is in the state of FIG. 10. A polyimide resin is often used for forming the alignment film of a liquid crystal display device. A light shielding film 603, a transparent conductive film 604, and an alignment film 605 are formed on an opposing substrate 602, which is opposed to the active matrix substrate. After forming the alignment films, a rubbing process is performed so that the liquid crystal molecules are oriented with a certain fixed pre-tilt angle. The active matrix substrate having a pixel matrix circuit and a CMOS circuit formed thereon and the opposing substrate are then bonded together by a sealing material or spacers (both not shown in the figures) in accordance with a known cell construction process. Next, a liquid crystal material 606 is injected between both the substrates, and the liquid crystal material is completely sealed therein by a sealing agent (not shown in the figures). A known liquid crystal material may be used as the liquid crystal material. The active matrix type liquid crystal display device shown in FIG. 15 is thus completed.

Next, the structure of the active matrix type liquid crystal display device will be explained with reference to the perspective view of FIG. 16 and the top view of FIG. 17. Note that to make the views of FIG. 16 and FIG. 17 correspond to the cross-sectional structure views of FIGS. 6A to 10 and FIG. 15, common reference numerals are used. Further, the cross-sectional structure taken along the line E-E' shown in FIG. 17 corresponds to the cross-sectional view of the pixel matrix circuit shown in FIG. 10.

Figure 16:
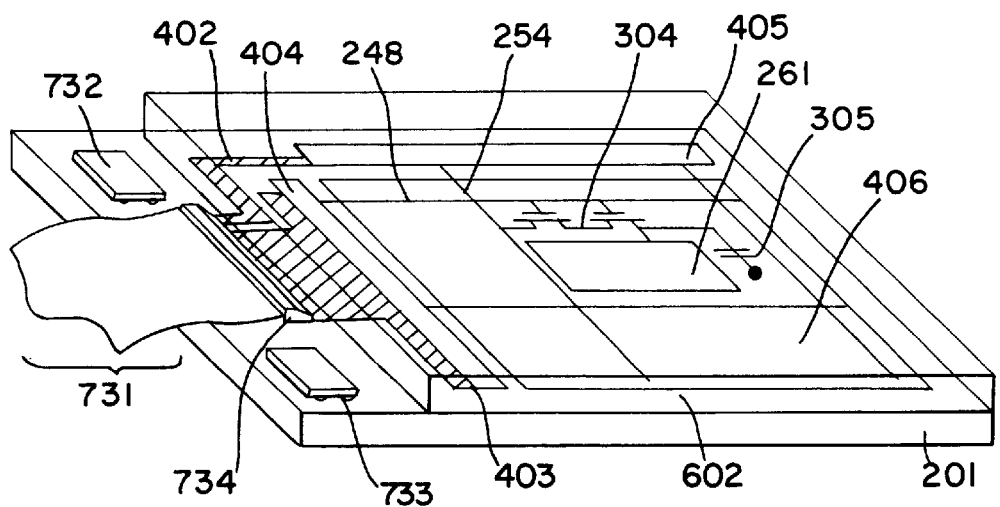
FIG. 16 is a perspective view showing the structure of the liquid crystal display device in accordance with Embodiment 2 of the present invention.

In FIG. 16, the active matrix substrate is composed of a pixel portion 406, a scanning signal driver circuit 404, and an image signal driver circuit 405 formed on the glass substrate 201. The pixel TFT 304 is provided in the display region, and the driver circuit provided in the periphery thereof is structured based on the CMOS circuit. The scanning signal driver circuit 404 and the image signal driver circuit 405 are connected to the pixel TFT 304 by the gate wiring 248 and the source wiring 254, respectively. Further, an FPC (Flexible Print Circuit) 731 is connected to an external input terminal 734, and input wirings 402 and 403 are connected to the respective driver circuits. Reference numerals 732 and 733 show IC chips.

Figure 17:
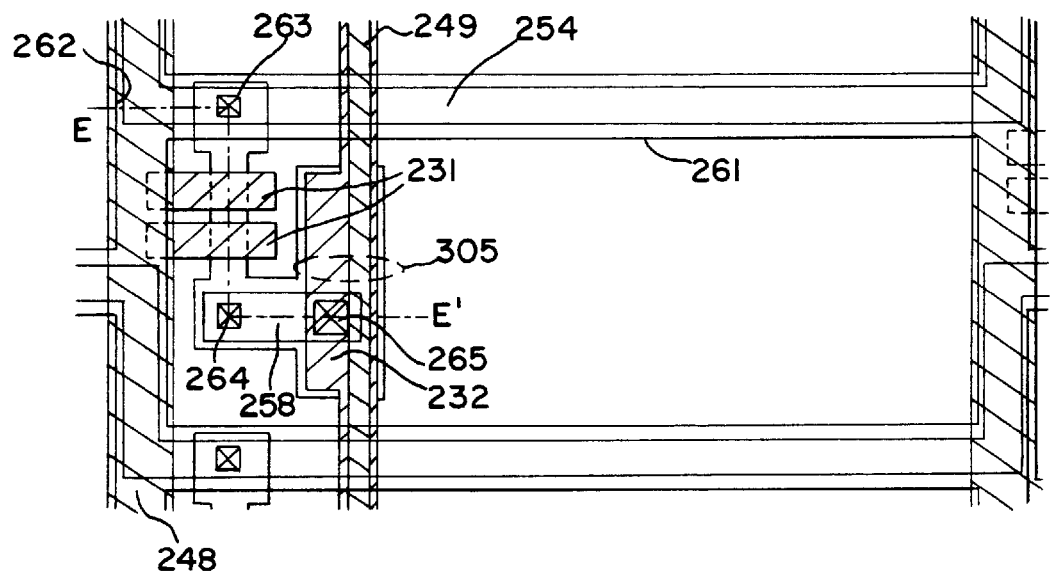
FIG. 17 is a top view showing a display region in accordance with Embodiment 2 of the present invention.

FIG. 17 is a top view showing nearly one full pixel of the display region 406. The gate wiring 248 intersects with the semiconductor layer 207 underneath through a gate insulating film that is not shown in the figure. Also, although not shown in the figure, a source region, a drain region, and an Loff region that is formed from an n⁻ region are formed in the semiconductor layer. Further, reference numeral 263 denotes a contact portion of the source wiring 954 and the source region 324, reference numeral 264 denotes a contact portion of the drain wiring 258 and the drain region 326, and reference numeral 265 denotes a contact portion of the drain wiring 258 and the pixel electrode 261. The storage capacitor 305 is formed of the region in which the semiconductor layer 327 extending from the drain region 326 of the pixel TFT 304 and the capacitor wirings 232 and 249 overlap with each other through the gate insulating film.

Note that the active matrix type liquid crystal display device of Embodiment 2 is explained with reference to the structure described in Embodiment 1. However, the structure thereof is not limited to that of Embodiment 1, and an active matrix substrate completed by applying the processes shown in Embodiment Mode 1 to Embodiment 1 may be used. Whichever is used, the active matrix substrate may be freely combined to manufacture an active matrix type liquid crystal display device, provided that it is an active matrix substrate with the blocking layer provided according to the present invention.

[Embodiment 3]

The active matrix substrate and the liquid crystal display device manufactured by implementing the present invention can be used in various electronic devices. In other words, the present invention can be implemented to all electronic equipment that incorporates these kinds of electronic devices as a display portion.

The following can be given as such electronic equipment: a video camera, a digital camera, a projector (rear type or front type), a head mount display (goggle type display), a car navigation system, a personal computer, and a portable information terminal (such as a mobile computer, a portable telephone, or an electronic book). Some examples of these are shown in FIGS. 18A to 19B.

Figure 18A:
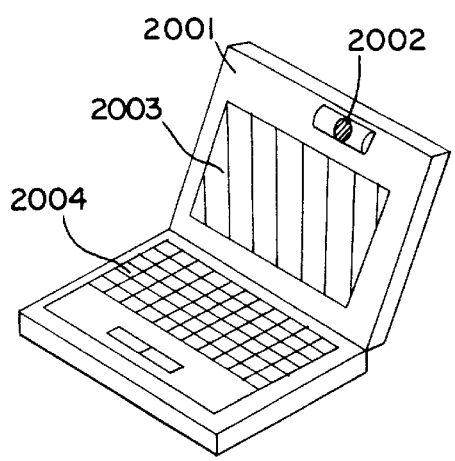
FIGS. 18A to 18F are diagrams showing examples of electronic equipment in accordance with Embodiment 3 of the present invention.

FIG. 18A shows a personal computer which is composed of a main body 2001, an image input unit 2002, a display device 2003, and a keyboard 2004. The present invention can be applied to the image input unit 2002, the display device 2003, and other signal control circuits.

Figure 18B:
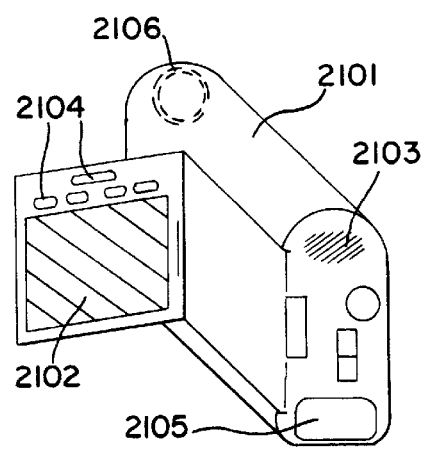

FIG. 18B shows a video camera, which is composed of a main body 2101, a display device 2102, an audio input unit 2103, operation switches 2104, a battery 2105, and an image receiving unit 2106. The present invention can be applied to the display device 2102, the audio input unit 2103, and other signal control circuits.

Figure 18C:
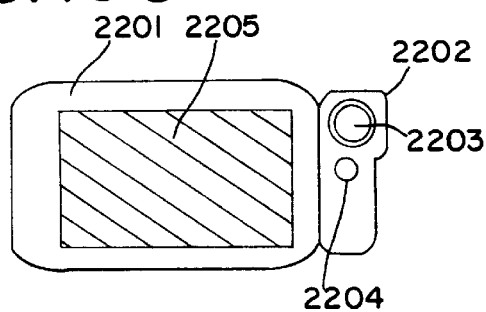

FIG. 18C shows a mobile computer, which is composed of a main body 2001, a camera unit 2202, an image receiving unit 2203, operation switches 2204, and a display device 2205. The present invention can be applied to the display device 2205 and other signal control circuits.

Figure 18D:
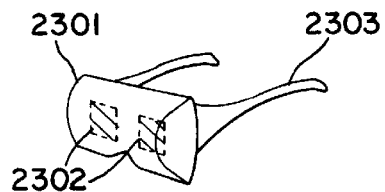

FIG. 18D shows a goggle type display, which is composed of a main body 2301, a display device 2302, and arm portions 2303. The present invention can be applied to the display device 2302 and other signal control circuits.

Figure 18E:
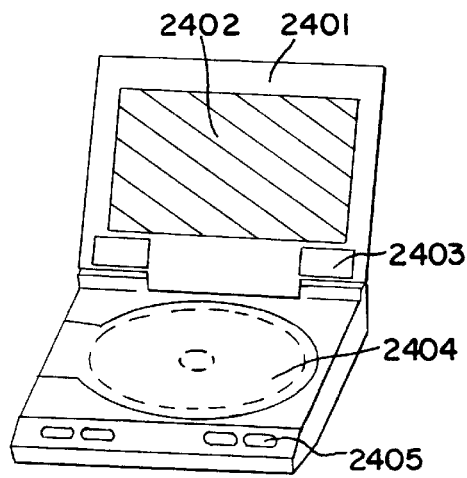

FIG. 18E shows a player which uses a recording medium with a program recorded therein (hereinafter referred to as a recording medium), and which is composed of a main body 2401, a display device 2402, a speaker unit 2403, a recording medium 2404, and operation switches 2405. Note that a DVD (Digital Versatile Disk) or CD (Compact Disk) is used as a recording medium for this device, and that appreciation of music or a movie or performing games or the Internet can be done. The present invention can be applied to the display device 2402 and other signal control circuits.

Figure 18F:
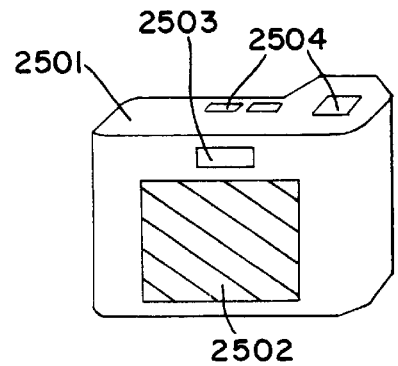

FIG. 18F shows a digital camera, which is composed of a main body 2501, a display device 2502, an eye piece portion 2503, operation switches 2504, and an image receiving unit (not shown in the figure). The present invention can be applied to the display device 2502 and other signal control circuits.

Figure 19A:
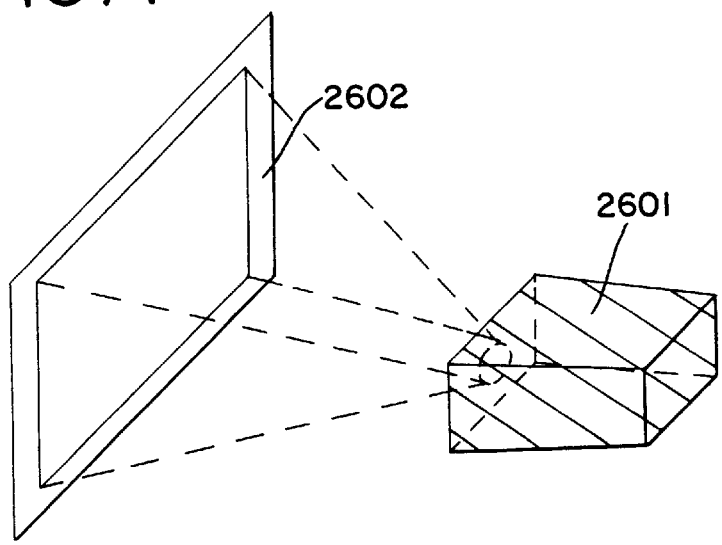
FIGS. 19A and 19B are diagrams showing examples of electronic equipment in accordance with Embodiment 3 of the present invention.

FIG. 19A shows a front type projector, which is composed of an optical light source system and display device 2601, and a screen 2602. The present invention can be applied to the display device and other signal control circuits.

Figure 19B:
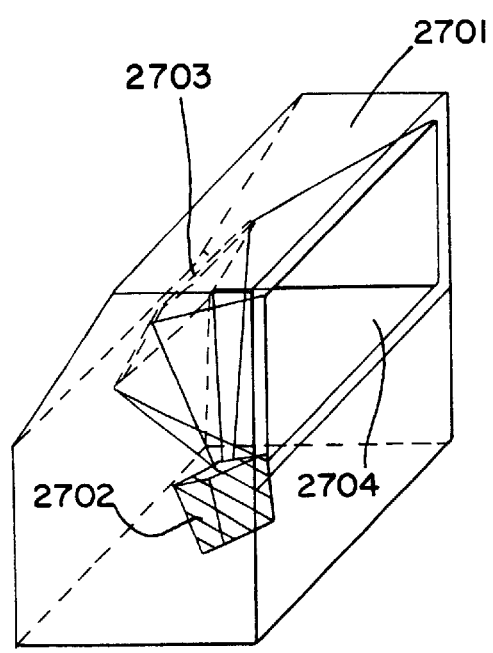

FIG. 19B shows a rear type projector, which is composed of a main body 2701, an optical light source system and display device 2702, a mirror 2703, and a screen 2704. The present invention can be applied to the display device and other signal control circuits.

Thus, the application range for the present invention is extremely wide, and the present invention may be applied to electronic equipment in all fields. Further, the electronic equipment of Embodiment 3 can be realized with a composition that uses any combination of Embodiment Mode 1 and Embodiments 1 and 2.

In the semiconductor device having the TFTs formed on the substrate, the silicon oxynitride film (A) is formed to a thickness of between 50 nm and 100 nm on the substrate and in contact therewith and then the silicon oxynitride film (B) is further formed to a thickness of between 30 nm and 70 nm to laminate on the silicon oxynitride film (A), thereby forming the blocking layer. Consequently, not only can be the active layer prevented from being contaminated by impurities such as alkali metallic elements, but the fluctuations in the values of the electrical characteristics of the TFTs inside the surface of the substrate such as the Vth and the S-value can be made smaller.

By using a TFT manufactured in accordance with the above-described method, the driving voltage and consumption power of the semiconductor device are reduced. Furthermore, an active matrix type liquid crystal display device having a high reproductivity in gradation display can be manufactured.

What is claimed is:

1. A semiconductor device having at least one thin film transistor over a substrate, comprising:
   a first silicon oxynitride film formed in contact with the substrate, a second silicon oxynitride film formed in contact with the first silicon oxynitride film, and a semiconductor layer on the second silicon oxynitride film,
   wherein a composition ratio of nitrogen to oxygen of the first silicon oxynitride film is larger than that of the second silicon oxynitride film, and
   wherein a film thickness of the first silicon oxynitride film is between 50 nm and 100 nm, and a film thickness of the second silicon oxynitride film is between 30 nm and 70 nm.

2. A semiconductor device according to claim 1, wherein the composition ratio of nitrogen to oxygen of the first silicon oxynitride film is between 0.6 and 1.5, and the composition ratio of nitrogen to oxygen of the second silicon oxynitride film is between 0.01 and 0.4.

3. A semiconductor device according to claim 1, wherein a composition ratio of hydrogen to oxygen of the first silicon oxynitride film is between 0.3 and 1.5, and a composition ratio of hydrogen to oxygen of the second silicon oxynitride film is between 0.001 and 0.15.

4. A semiconductor device according to claim 1, wherein an oxygen concentration of the first silicon oxynitride film is between 20 atomic % and 30 atomic % and a nitrogen concentration thereof is between 20 atomic % and 30 atomic %, and an oxygen concentration of the second silicon oxynitride film is between 55 atomic % and 65 atomic % and a nitrogen concentration thereof is between 1 atomic % and 20 atomic %.

5. A semiconductor device according to claim 1, wherein a hydrogen concentration of the first silicon oxynitride film is between 10 atomic % and 20 atomic %, and a hydrogen concentration of the second silicon oxynitride film is between 0.1 atomic % and 10 atomic %.

6. A semiconductor device according to claim 1, wherein a density of the first silicon oxynitride film is between $8 \times 10^{22}$ atoms/cm$^3$ and $2 \times 10^{23}$ atoms/cm$^3$, and a density of the second silicon oxynitride film is between $6 \times 10^{22}$ atoms/cm$^3$ and $9 \times 10^{22}$ atoms/cm$^3$.

7. A semiconductor device according to claim 1, wherein the semiconductor device is an active matrix type liquid crystal display device.

8. A semiconductor device according to claim 1, wherein the semiconductor device is at least one selected from the group consisting of a personal computer, a video camera, a mobile computer, a goggle type display, a player which uses a recording medium, a digital camera, and a projector.

9. A semiconductor device having at least one thin film transistor over a substrate, comprising:
   a first silicon oxynitride film formed in contact with the substrate, a second silicon oxynitride film formed in contact with the first silicon oxynitride film, and a semiconductor layer on the second silicon oxynitride film,
   wherein a composition ratio of hydrogen to oxygen of the first silicon oxynitride film is larger than that of the second silicon oxynitride film, and
   wherein a film thickness of the first silicon oxynitride film is between 50 nm and 100 nm. and a film thickness of the second silicon oxynitride film is between 30 nm and 70 nm.

10. A semiconductor device according to claim 9, wherein a composition ratio of nitrogen to oxygen of the first silicon oxynitride film is between 0.6 and 1.5, and a composition ratio of nitrogen to oxygen of the second silicon oxynitride film is between 0.01 and 0.4.

11. A semiconductor device according to claim 9, Wherein the composition ratio of hydrogen to oxygen of the first silicon oxynitride film is between 0.3 and 1.5, and the composition ratio of hydrogen to oxygen of the second silicon oxynitride film is between 0.001 and 0.15.

12. A semiconductor device according to claim 9, wherein an oxygen concentration of the first silicon oxynitride film is between 20 atomic % and 30 atomic % and a nitrogen concentration thereof is between 20 atomic % and 30 atomic %, and an oxygen concentration of the second silicon oxynitride film is between 55 atomic % and 65 atomic % and a nitrogen concentration thereof is between 1 atomic % and 20 atomic %.

13. A semiconductor device according to claim 9, wherein a hydrogen concentration of the first silicon oxynitride film is between 10 atomic % and 20 atomic %, and a hydrogen concentration of the second silicon oxynitride film is between 0.1 atomic % and 10 atomic %.

14. A semiconductor device according to claim 9, wherein a density of the first silicon oxynitride film is between $8 \times 10^{22}$ atoms/cm$^3$ and $2 \times 10^{23}$ atoms/cm$^3$, and a density of the second silicon oxynitride film is between $6 \times 10^{22}$ atoms/cm$^3$ and $9 \times 10^{22}$ atoms/cm$^3$.

15. A semiconductor device according to claim 9, wherein the semiconductor device is an active matrix type liquid crystal display device.

16. A semiconductor device according to claim 9, wherein the semiconductor device is at least one selected from the group consisting of a personal computer, a video camera, a mobile computer, a goggle type display, a player which uses a recording medium, a digital camera, and a projector.

17. A semiconductor device having at least one thin film transistor over a substrate, comprising:
a first silicon oxynitride film formed in contact with the substrate, a second silicon oxynitride film formed in contact with the first silicon oxynitride film, and a semiconductor layer on the second silicon oxynitride film,
wherein an oxygen concentration of the second silicon oxynitride film is larger than that of the first silicon oxynitride film, and
wherein a film thickness of the first silicon oxynitride film is between 50 nm and 100 nm, and a film thickness of the second silicon oxynitride film is between 30 nm and 70 nm.

18. A semiconductor device according to claim 17, wherein a composition ratio of nitrogen to oxygen of the first silicon oxynitride film is between 0.6 and 1.5, and a composition ratio of nitrogen to oxygen of the second silicon oxynitride film is between 0.01 and 0.4.

19. A semiconductor device according to claim 17, wherein a composition ratio of hydrogen to oxygen of the first silicon oxynitride film is between 0.3 and 1.5, and a composition ratio of hydrogen to oxygen of the second silicon oxynitride film is between 0.001 and 0.15.

20. A semiconductor device according to claim 17, wherein the oxygen concentration of the first silicon oxynitride film is between 20 atomic % and 30 atomic % and a nitrogen concentration thereof is between 20 atomic % and 30 atomic %, and the oxygen concentration of the second silicon oxynitride film is between 55 atomic % and 65 atomic % and a nitrogen concentration thereof is between 1 atomic % and 20 atomic %.

21. A semiconductor device according to claim 17, wherein a hydrogen concentration of the first silicon oxynitride film is between 10 atomic % and 20 atomic %, and a hydrogen concentration of the second silicon oxynitride film is between 0.1 atomic % and 10 atomic %.

22. A semiconductor device according to claim 17, wherein a density of the first silicon oxynitride film is between $8 \times 10^{22}$ atoms/cm$^3$ and $2 \times 10^{23}$ atoms/cm$^3$, and a density of the second silicon oxynitride film is between $6 \times 10^{22}$ atoms/cm$^3$ and $9 \times 10^{22}$ atoms/cm$^3$.

23. A semiconductor device according to claim 17, wherein the semiconductor device is an active matrix type liquid crystal display device.

24. A semiconductor device according to claim 17, wherein the semiconductor device is at least one selected from the group consisting of a personal computer, a video camera, a mobile computer, a goggle type display, a player which uses a recording medium, a digital camera, and a projector.

25. A semiconductor device having at least one thin film transistor over a substrate, comprising:
a first silicon oxynitride film formed in contact with the substrate, a second silicon oxynitride film formed in contact with the first silicon oxynitride film, and a semiconductor layer on the second silicon oxynitride film,
wherein a nitrogen concentration of the first silicon oxynitride film is larger than or equal to that of the second silicon oxynitride film, and
wherein a film thickness of the first silicon oxynitride film is between 50 nm and 100 nm, and
a film thickness of the second silicon oxynitride film is between 30 nm and 70 nm.

26. A semiconductor device according to claim 25, wherein a composition ratio of nitrogen to oxygen of the first silicon oxynitride film is between 0.6 and 1.5, and a composition ratio of nitrogen to oxygen of the second silicon oxynitride film is between 0.01 and 0.4.

27. A semiconductor device according to claim 25, wherein a composition ratio of hydrogen to oxygen of the first silicon oxynitride film is between 0.3 and 1.5, and a composition ratio of hydrogen to oxygen of the second silicon oxynitride film is between 0.001 and 0.15.

28. A semiconductor device according to claim 25, wherein an oxygen concentration of the first silicon oxynitride film is between 20 atomic % and 30 atomic % and the nitrogen concentration thereof is between 20 atomic % and 30 atomic %, and an oxygen concentration of the second silicon oxynitride film is between 55 atomic % and 65 atomic % and the nitrogen concentration thereof is between 1 atomic % and 20 atomic %.

29. A semiconductor device according to claim 25, wherein a hydrogen concentration of the first silicon oxynitride film is between 10 atomic % and 20 atomic %, and a hydrogen concentration of the second silicon oxynitride film is between 0.1 atomic % and 10 atomic %.

30. A semiconductor device according to claim 25, wherein a density of the first silicon oxynitride film is between $8 \times 10^{22}$ atoms/cm$^3$ and $2 \times 10^{23}$ atoms/cm$^3$, and a density of the second silicon oxynitride film is between $6 \times 10^{22}$ atoms/cm$^3$ and $9 \times 10^{22}$ atoms/cm$^3$.

31. A semiconductor device according to claim 25, wherein the semiconductor device is an active matrix type liquid crystal display device.

32. A semiconductor device according to claim 25, wherein the semiconductor device is at least one selected from the group consisting of a personal computer, a video camera, a mobile computer, a goggle type display, a player which uses a recording medium, a digital camera, and a projector.

33. A semiconductor device having at least one thin film transistor over a substrate, comprising:
a first silicon oxynitride film formed in contact with the substrate, a second silicon oxynitride film formed in contact with the first silicon oxynitride film, and a semiconductor layer on the second silicon oxynitride film,
wherein a hydrogen concentration of the first silicon oxynitride film is larger than or equal to that of the second silicon oxynitride film, and
wherein a film thickness of the first silicon oxynitride film is between 50 nm and 100 nm, and a film thickness of the second silicon oxynitride film is between 30 nm and 70 nm.

34. A semiconductor device according to claim 33, wherein a composition ratio of nitrogen to oxygen of the first silicon oxynitride film is between 0.6 and 1.5, and a composition ratio of nitrogen to oxygen of the second silicon oxynitride film is between 0.01 and 0.4.

35. A semiconductor device according to claim 33, wherein a composition ratio of hydrogen to oxygen of the first silicon oxynitride film is between 0.3 and 1.5, and a composition ratio of hydrogen to oxygen of the second silicon oxynitride film is between 0.001 and 0.15.

36. A semiconductor device according to claim 33, wherein an oxygen concentration of the first silicon oxynitride film is between 20 atomic % and 30 atomic % and a nitrogen concentration thereof is between 20 atomic % and 30 atomic %, and an oxygen concentration of the second silicon oxynitride film is between 55 atomic % and 65 atomic % and a nitrogen concentration thereof is between 1 atomic % and 20 atomic %.

37. A semiconductor device according to claim 33, wherein the hydrogen concentration of the first silicon oxynitride film is between 10 atomic % and 20 atomic %, and the hydrogen concentration of the second silicon oxynitride film is between 0.1 atomic % and 10 atomic %.

38. A semiconductor device according to claim 33, wherein a density of the first silicon oxynitride film is between $8\times10^{22}$ atoms/cm$^3$ and $2\times10^{23}$ atoms/cm$^3$, and a density of the second silicon oxynitride film is between $6\times10^{22}$ atoms/cm$^3$ and $9\times10^{22}$ atoms/cm$^3$.

39. A semiconductor device according to claim 33, wherein the semiconductor device is an active matrix type liquid crystal display device.

40. A semiconductor device according to claim 33, wherein the semiconductor device is at least one selected from the group consisting of a personal computer, a video camera, a mobile computer, a goggle type display, a player which uses a recording medium, a digital camera, and a projector.

\* \* \* \* \*